(12) United States Patent
Peyerl et al.

(10) Patent No.: US 6,272,441 B1
(45) Date of Patent: Aug. 7, 2001

(54) METHOD FOR DETERMINING THE PULSE RESPONSE OF A BROAD BAND LINEAR SYSTEM AND A MEASURING CIRCUIT FOR CARRYING OUT THE METHOD

(76) Inventors: Peter Peyerl, Hartmann-Schaffer-Str. 20, D-98593 Ilmenau; Jürgen Sachs, Gartenstrasse 15, D-98711 Schmiedefield, both of (DE)

(*) Notice: Subject to any disclaimer, the term of this patent is extended or adjusted under 35 U.S.C. 154(b) by 0 days.

(21) Appl. No.: 09/417,036

(22) Filed: Oct. 12, 1999

(30) Foreign Application Priority Data

Oct. 12, 1998 (DE) .............................. 198 46 870

(51) Int. Cl.$^7$ ............................................ G01R 35/00
(52) U.S. Cl. ................... 702/112; 702/110; 702/122; 324/76.21; 324/76.24; 708/400
(58) Field of Search .................. 702/109, 110, 702/112, 122, 124–126; 324/76.19, 76.21, 76.22, 76.24; 708/309, 400, 403

(56) References Cited

U.S. PATENT DOCUMENTS

| | | | |
|---|---|---|---|
| 3,710,082 | * | 1/1973 | Sloane et al. .................. 700/280 |
| 3,714,566 | * | 1/1973 | Kang ............................... 324/76.22 |
| 4,067,060 | * | 1/1978 | Poussart et al. ................ 702/110 |
| 5,168,456 | * | 12/1992 | Hyatt ............................... 708/422 |
| 5,555,507 | * | 9/1996 | Wolf et al. ..................... 702/122 |

FOREIGN PATENT DOCUMENTS 42 09 761   10/1992 (DE) .

OTHER PUBLICATIONS

M. Vorländer, "Applications of the Maximal Sequence Measuring Technique in Acoustics", Advances in Acoustics––DAGA 94 in Bad Honneff: DPG GmbH 1994, pp. 83–102, (No translation).

H. Alrutz, "Concerning the Application of Random Noise Sequences for Measuring of Linear Transmission Systems", Göttingen, 1983, pp. 56–58 (No translation).

* cited by examiner

*Primary Examiner*—Patrick Assouad
*Assistant Examiner*—Bryan Bui
(74) *Attorney, Agent, or Firm*—Collard & Roe, P.C.

(57) ABSTRACT

The invention relates to a method for the determination of the impulse response g(t) of a broad band linear system. The method can be used for the application of high frequency technology. For a test signal, a maximum length binary sequence (MLBS) is employed. The measured signal, obtained by the system, is sampled under maintenance of the sample theorem whereby the sampling clock in accordance with the invention is obtained directly from that high frequency clock pulse which is used for the generation of the MLBS. The digitized measured signal is then subjected to a fast Hadamard-transformation for calculation of the impulse response. The invention furthermore, provides a measuring circuit which carries out this method.

17 Claims, 11 Drawing Sheets

FIG.8

METHOD FOR DETERMINING THE PULSE RESPONSE OF A BROAD BAND LINEAR SYSTEM AND A MEASURING CIRCUIT FOR CARRYING OUT THE METHOD

BACKGROUND OF THE INVENTION

1. Field of the Invention

This invention relates to a method and a circuit for determining the impulse response of a broad band linear system. More specifically, the invention relates to a method in which the impulse response of such a system can be determined in the high frequency range at approximately 100 MHz to 10 Ghz. Specifically, this invention also provides a method for the determining the impulse response of multi-channel broad band linear systems. The invention, furthermore, provides a circuit for carrying out such methods.

2. The Prior Art

In electrical and electronics engineering the transmission characteristics of linear systems are, for example, determined and characterized by the impulse response g(t) or, respectively, the transfer function G(f). The term linear system means any system in which the output magnitudes y(t) are to the input magnitudes x(t) in a relation which is defined as follows:

$$y(t) = \int g(\tau) x(t-\tau) d\tau \qquad 1$$

$$Y(f) = G(f) X(f) \qquad 2$$

In systems with an input x and an output and scalar equations result, while in the case of systems having a plurality of inputs and outputs are described by matrix relations. The impulse response g(t) or, respectively the transfer function G(f) are representative of the characteristics of the system under consideration.

In the development, manufacture, and research of any desired technical system, particularly of UWB sensors (ultra wideband sensors) and sensor arrays, the metrological determination of the impulse response or, respectively of the transfer function becomes a substantial question.

In the state of the art for the metrological determination of the impulse response or, respectively, for the transmission function, there are three basic principles in use. In the so-called pulse metrological technique, all inputs of the system which are under investigation are respectively controlled with a small impulse and the output signals are measured at all outputs of the systems. In the ideal case, Dirac pulse is used. When the above mentioned integral equation (1) is solved, the impulse response of the system can be determined. The particular difficulties of this method are that a rather steep input impulse with a high voltage needs to be applied at the inputs, so as to largely eliminate potentially present interferences. Measuring systems, which operate in the region of interest in the high and highest frequency range when using the impulse determination method, provide only a low measuring speed, and requires a substantial amount of equipment.

A second method which is in practical use is the so-called sinus measuring technique wherein test signals are introduced into the system under study comprised of a multiplicity of sinusoidal vibrations of varying frequencies. Due to the required large number of varying frequencies in the test signals, this technique is slow and requires a large amount of equipment.

As a third method there is known the correlation measuring technique. In contrast to the impulse and sinus measuring techniques, any desired signal wave forms can be introduced as a test signal, provided their band width is sufficiently large. In contrast to the sinus measuring technique, all determinations and considerations are done not in the frequency range but in the respective time range. Between the correlation functions for systems with K inputs and L outputs the following relationships apply:

$$\psi_{xy}(\tau) = \int g(\xi) \psi_{xx}(\xi - \tau) d\xi \qquad (3)$$

with $$\psi_{xy}(\tau) = \int y(t) x^T(t+\tau) dt \qquad [L,K]\text{—Matrix}$$

$$\psi_{xx}(\tau) = \int x(t) x^T(t+\tau) dt \approx \delta(\tau) D \qquad [K,K]\text{—Matrix}$$

$x$ is the Transponent of x.

$x(t) = [x_1(t), x_2(t), \ldots, x_K(t)]^T$ —Vector for the input signals $y(t) = [y_1(t), y_2(t), \ldots, y_L(t)]^T$ —Vector for the output signals D—Diagonal matrix As test signals these signals are to selected as the auto-correlation matrix which is most closely related to a diagonal matrix of Dirac functions.

The required demands of the UWB correlation methods are fulfilled by known systems only partially or with a great deal of effort. Furthermore, it is desirable that the band width which is applied to the system, can be varied in a simple manner, with one and the same measuring device, to evaluate differing systems, or respectively, differing characteristics of the same system in varying frequency ranges. Since such requirements cannot be fulfilled with known correlation measuring methods, correlation measuring methods were employed only on a limited scale, in the metrology of high frequency systems.

In the paper: "Applications of the Maximal Sequence Measuring Technique in Acoustics'" by M. Vorländer, which appeared in the symposia publications "Advances in Acoustics—DAGA 94" in Bad Honnef: DPG GmbH 1994, there is provided a correlation measuring method. This measuring method uses a maximum length binary sequences (MLBS) as a stimulation signal for the device under test. The output signal is subjected to a Hadamard transformation to furnish the desired impulse response. From the output signals generated from the impulse response, these are subjected to a Hadamard-transformation as input signals for the system under investigation. From this article, the convolution integral of the correlation measuring technique is also known in its general form.

$$\Phi_{ss'}(\tau) = \int_{-\infty}^{\infty} h(t') \Phi_{ss}(\tau - t') dt' \approx h(\tau)$$

There is an advantage from the correlation measuring technique wherein the instigating signal per se need not be similar to a Dirac input, but it should be its auto-correlation function. This is particularly useful with respect to the control of the system and the signal/noise ratio. Periodic binary random noise signals are referred to MLBS with an auto-correlation function, which is close to a Dirac input.

The aforementioned article shows the application of a correlation measuring technique, particularly the MLBS measuring technique in the domain of acoustics. With the known method and the respective apparatus, however, no measurements can be carried out in the high frequency range.

In the dissertation of H. Alrutz with the title "Concerning the application of random noise sequences for measuring of liner transmission systems," Göttingen, 1983, inter alia the possibility is also discussed of utilizing MLBS as test signals for measuring in the high frequency range. Thereby, a MLBS generator is proposed which employs two shift registers, and a fast comparator. With this arrangement the MLBS can be synchronized with a sample clock pulse whereby it is possible to have one sampling only per period of the MLBS. Multi-sampling within a period, which are a prerequisite for the increase in velocity/speed, can not be carried out, Furthermore the cascading of several measuring units is difficult.

In German Patent 4209761 A1 there is described a method for the determination of the transmission characteristics of an electrical system. In the system under investigation a test signal is introduced, the auto-correlation function of which is a delta pulse. At the output the received signal is evaluated in the manner so that it is cross-correlated with a reference signal. The output signal then is representative of the transmission characteristics of the system. This method is mainly used for the investigation of line/conduction characteristics and is not applicable for the fast measuring of multi-channel systems.

SUMMARY OF THE INVENTION

It is an object of the invention to overcome existing problems and to provide a method for determining the impulse response of a broad band linear system to avoid the detriments of the state of the art This is involves a high rate of measuring and a largely digital measured valued handling, so as to make feasible a sufficiently sensitive measuring arrangement with high precision. Furthermore it is an object due to the measuring method, to provide a solution including integrated circuit architecture techniques which serve the configuration of economic, multi-channel, and robust measuring systems.

The method of the invention has the advantage that a high frequency MLBS can be used as an input signal from the system under investigation. This permits the use of a mathematical formula which is known as a Hadamard-transformation, whereby the correlation between input and output signal can be realized in a simple manner, so that, as result of this correlation the impulse response of the system can be determined. With a simple integrated configuration and, through application of the method in accordance with the invention, the impulse response of high frequency systems can be determined with high accuracy. A further advantage of the method in accordance with the invention which arises from using a MLBS as a test signal, is that the energy dispersion takes place over a full period of the MLBS, in contrast to an otherwise required very large, energy strong pulse used as a test signal. This allows simple and economic components to be used such as output amplifiers and receivers.

An advantageous embodiment of the method of the invention is that the frequency fc of the high frequency clock pulse is adjustable. By varying the clock pulse frequency, the band width of the test signal can be, easily adapted to the desired requirements. Changing the clock pulse frequency causes an inversely proportional change of the pulse width of the MLBS, and therewith a change of the band width of the test signal which is fed to the system under investigation It can also be of advantageous to change the clock pulse in a defined manner during a measurement. The sample clock pulse of the receiver branch is directly coupled to the high frequency clock pulse via a predetermined division/distribution ratio, such that the change of the high frequency clock pulse is followed by a change of the sample clock pulse, through which the received signals without further problems can be evaluated as measured signals. On the other hand, the change of the clock pulse is causing a "blur" of the excitation spectrum and, thereby, an imprecise spectral response ensues. Additionally, the order m of the MLBS is adjustable at will. Such measuring systems are difficult to locate from the outside, so that these embodiments are of interest when radar determinations are to be carried out in a non-cooperative environment, or several systems of like type are not to interfere with one another.

In a preferred embodiment of the invention the distribution ratio for the generation of the sample clock pulse is adjustable. In this manner the sample clock pulse can be adapted to the speed of an analog—digital converter which converts the sampled analog values into digital sampling values. The method can be applied, accordingly, to various equipment-configuration requirements, whereby with regard to availability and cost budget for special applications a usable analog-digital converter can be selected.

In an advantageous embodiment, sample values are intermediately stored and are used in the sampling of the next following values of the measured signal as a reference value. The sampling time points are distributed over various periods, however, projected to a period, not more than a length of period $t_c$ of the high frequency clock pulse are at a distance from one another. In this manner, return sampling methods can be employed, whereby the measuring accuracy and band width are effectively enhanced.

In a further embodiment of the invention, the MLBS m(t) is impressed or modulated onto a high frequency carrier signal c(t), so as to shift the spectrum of the MLBS, and to make available, a modified (MLBS) n(t). It is particularly advantageous to have as a carrier signal the high frequency clock pulse signal $f_c$. This provides the advantage that the frequency spectrum of the (MLBS) is shifted to higher frequencies, so that band pass systems with very wide bands can be investigated.

A further variant of the invention, is provided for the determination of impulse responses of a broad band linear system which has several inputs an/or several outputs. In this embodiment, simultaneously or sequentially at each input of the system a (MLBS) is applied as test signal, while at each output of the system a measured signal is taken. To determine the impulse responses at least a plurality of measurements is taken, which correspond to the number of inputs of the system, whereby for each measurement a different combination of test signals is used. The impulse responses are then determined with the method according to the invention. It is particularly suitable when the clock pulse signals are arranged according to a combination scheme, which corresponding to a Hadamar matrix. This allows the simple calculation of impulse responses, and ensures simultaneously a wide interference distance during measuring.

Through the invention, there is also established a measuring arrangement which can be realized with the suggested method.

A preferred embodiment of this measuring arrangement provides a signal converter switch which delivers the (MLBS), provided by the generator for the (MLBS), to a non-negating or to a negating input of the output amplifier, or separates the coupling between (MLBS) generator and output amplifier. This is particularly useful when in the measuring arrangement, several high frequency configuration groups are operated which deliver signals to several inputs of a linear system or, respectively, receive measured signals from several outputs. The determined measured signals can, due to the different polarity be fed (MLBS) to the measured signal associated input signal.

In another embodiment the de-coupling of the (MLBS) from the output amplifier can also be realized by using a circuit input at the (MLBS) generator.

A further embodiment of the measuring arrangement is defined whereby a digital-analog converter is present which re-converts in a prior sampling cycle the determined sampling value into an analog feedback signal, which is passed to the sampling circuit at a return input. Such a circuit allows the utilization of a so-called return sampler (sampling circuit with return), whereby in subsequent sampling cycles respectively only the difference between the prior measured value and the new sampled value needs to be determined. In this manner, the sampling procedure can be substantially accelerated. Through appropriate intermediate storage of the sampled values as a feedback signal, the sampled value of the immediate prior period of the measuring signal can be used for further sampling. Alternately, or in combination with the just described principle, the measured signal can be evaluated over a plurality of periods, whereby the sample values which were obtained at the same sample point in time in one or several prior periods serve as to return a signal, so that the averaging can be performed over a plurality of periods.

In a further embodiment of the measuring arrangement the (MLBS) generator has a release input which receives a start/stop signal for starting of the MLBS. It is particularly useful when the start/stop signal is returned via a synchronization circuit which controls the point in time of introduction to the release input. This has a particular advantage in that the MLBS can be commenced at exact defined points in time, and simultaneously, simple digital circuit elements and lines/conductors can be employed. Also, the circuit-related effort for synchronous starting of several high frequency constructive groups is thereby held to a minimum.

It is particularly useful when the current supply unit of the measuring arrangement is a circuit-network party which is clocked pulsed with the sample clock pulse. The current supply unit constraint in-coupled interferences can then, in a known manner be filtered out of the actual measured signal.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings wherein similar reference characters denote similar elements throughout the several views:

FIG. 8 is a resultant matrix equation for carrying out the correlation and two matrix equations which result from sorting;

DETAILED DESCRIPTION OF THE PREFERRED EMBODIMENT

Figure 1:
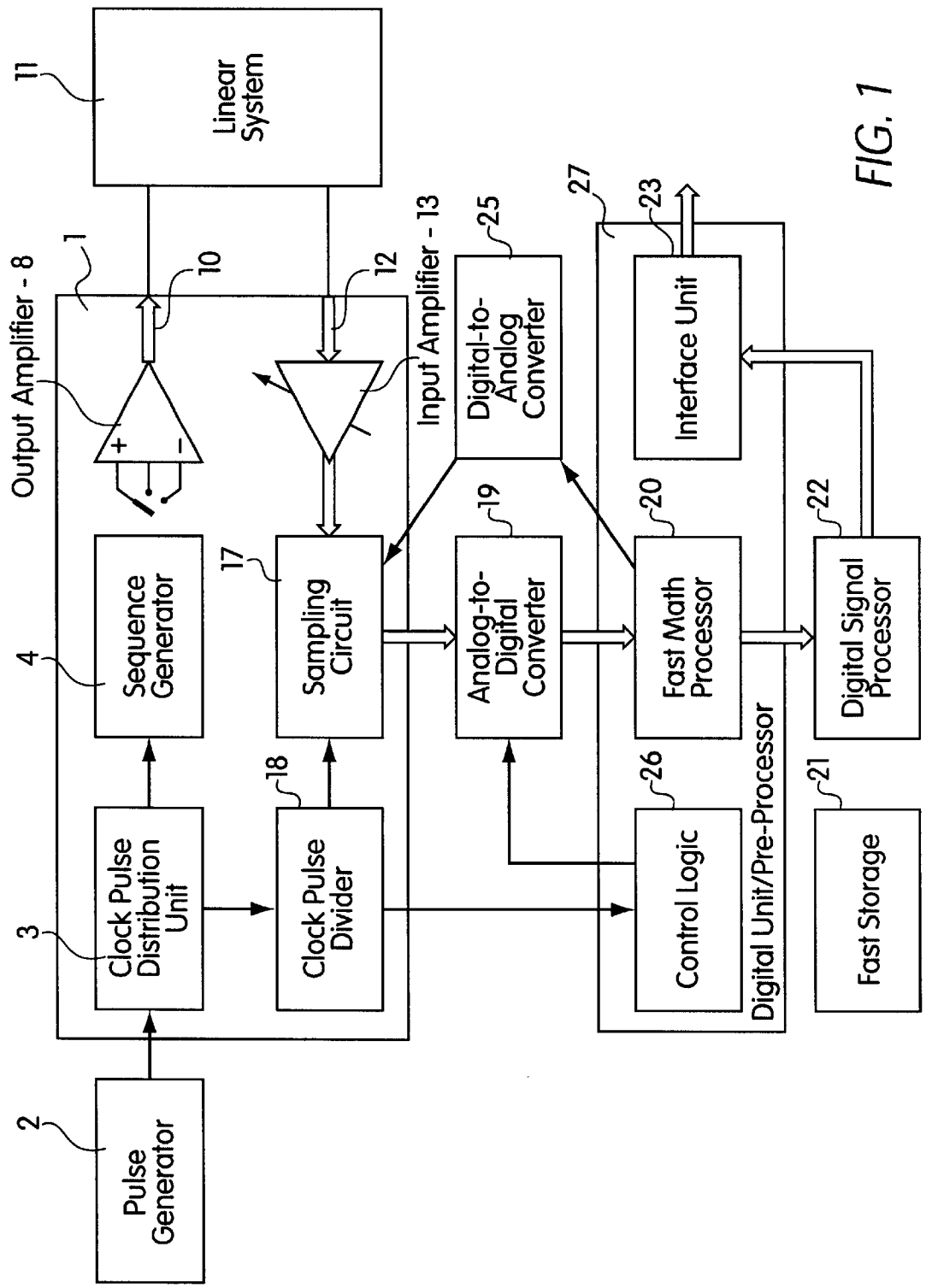
FIG. 1 a block circuit diagram of a measuring circuit for determining the impulse response of a broad band linear system.

FIG. 1 shows an electrical block diagram of a measuring circuit for determining of the impulse response of a broad band linear system. The measuring circuit has a high frequency (RF) component group 1 having an input coupled to a high frequency clock pulse with a frequency $f_c$ from a pulse generator 2. The high frequency clock pulse $f_c$ must be stabile for short periods of time. As will be discussed in greater detail below, the high frequency clock pulse $f_c$ determines the band width of the test signal which is being produced. Within the RF unit group 1 the high frequency clock pulse $f_c$ is distributed by a clock pulse distribution unit 3, to the transmission side components as well as to the receiving side components. In order to achieve precise results, there is provided a jitter proof and skew proof (without shifting over time), synchronized clock pulse distribution.

The entire measuring circuit is strictly pulsed, such that it follows changes of the high frequency clock pulse without time lag. The high frequency clock pulse $f_c$ should be held constant at least during the measuring of a sought impulse response so as to avoid "smear effects". An intentional variation of the high frequency clock pulse produces an immediate change of the sample point in time of the impulse response of the broad band linear system. When investigating linear, time varied systems, this can be utilized for interpolation between individual sampled values of the impulse response. Furthermore, the intentional coincidental change of the clock pulse frequency $f_c$ and as required, additionally the coincidental change of the order m of the maximum length binary sequence (MLBS) (see below) is useful, so as to "smear" the excitation spectrum and, thereby, also the spectrum of the impulse response, in order to make it more difficult to determine the location of the test signal sender, or to preclude the respective interference with respect to one another of systems of the same type.

The high frequency clock pulse is passed from clock pulse distribution unit 3 to a MLBS generator 4.

Figure 2:
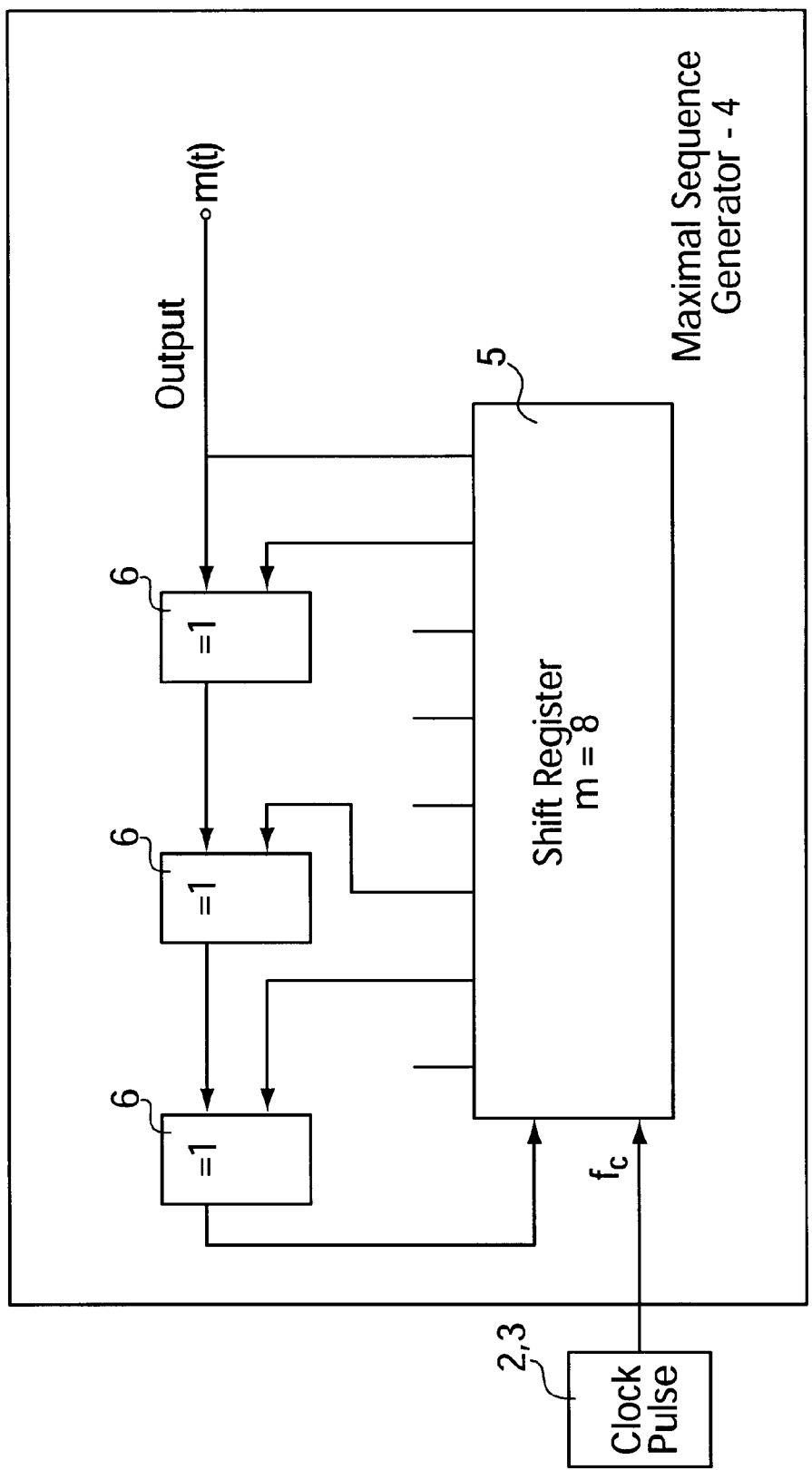
FIG. 2 a circuit block diagram of an exemplary maximal sequence generator

In FIG. 2 is presented a circuit block diagram of the possible configuration of the MLBS generator 4. Other principles are possible and can be used. There is shown a standard MLBS generator which is primarily comprised of a shift register 5. According to known circuitry design, individual outputs of shift register 5 are re-coupled via exclusive-or gates 6 to the input of the shift register. In the example shown, shift register 5 has eight shift positions, such that an order of m=8 is obtained. The MLBS is comprised of successive pulses which are combined to a binary pseudo-stochastic noise signal. Thus, a periodic signal is provided whereby the length of its period results from the amount of the possible combinations of pulse sequences, and is $2^m-1$. The particular characteristic of such MLBSs is that their auto-correlation function is very close to a Dirac input.

Figure 3:
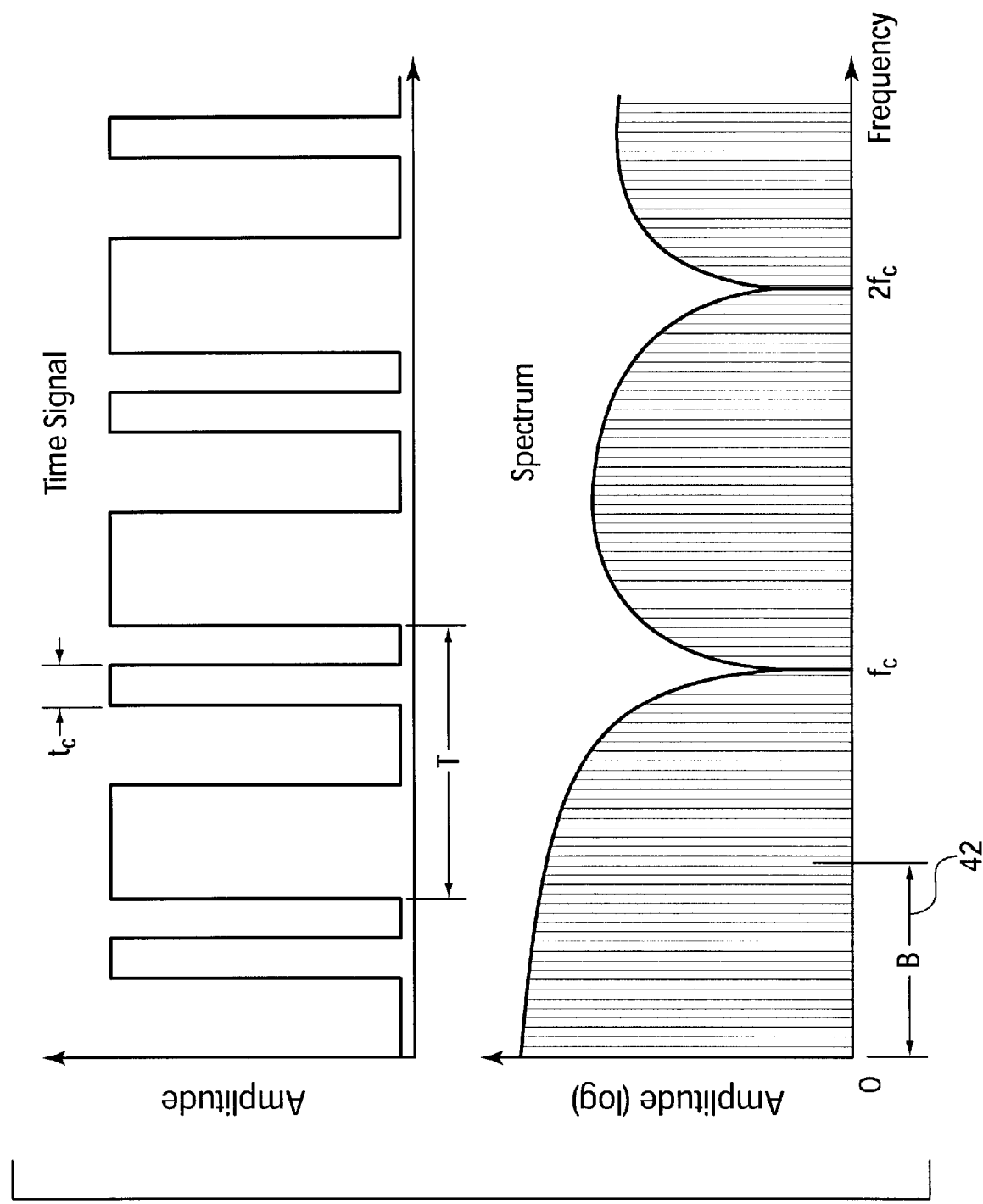
FIG. 3 shows the time course and the frequency spectrum of the maximal sequence.

FIG. 3 shows a diagram of a typical signal extent of (a very short: m=3) MLBS. The test signal has a large band width, in the event that the auto-correlation function is sufficiently short. A MLBS satisfies this requirement. In the MLBS portion shown in FIG. 3, there is indicated in the upper part a period of time T of the MLBS. There is also given the pulse duration $t_c$ of a single pulse. The MLBS is comprised of a quasi coincidental combination of $2^m-1$ individual pulses.

In the lower part of FIG. 3 is shown the typical spectrum of a MLBS whereby the position in the spectrum, corresponding to the rate of clock pulse $f_c$ is particularly pointed out. At this position, there is the first zero (null) position of the broad band spectrum. Here, the equation $f_n = t_c^{-1}$ applies. In the drawing is shown the width B (42) for measuring the usable range of the spectrum. Since the equivalent sampling rate corresponds to the clock pulse $f_c$, there must be $B \leq \frac{1}{2} f_c$ so as not to violate the sample theorem.

With the present day available circuitry elements, MLBS generators can be made according to the configuration shown in principle in FIG. 2, which are capable of producing MLBSs with very high frequencies. With the method and apparatus of the invention, there are generated, for example, clock pulse frequencies of $f_c=10$ GHz, and processed/converted in the MLBS generator.

Returning to FIG. 1, MLBS generator 4 passes the MLBS m(t) via a signal conversion switch to an input of the output amplifier/de-coupling amplifier 8. In simple cases, the signal conversion switch may not need to be used. The Output amplifier 8 has a negating and a non-negating input. With the aid of output amplifier 8, the MLBS is amplified to the appropriate extent and de-coupled by the shift register, so as to be provided as an output 10, as a test signal x(t) to a broad band linear system 11. Linear system 11 is the measuring object which is to be investigated. The MLBS fed to linear system 11, via output 10, passes therethrough and is thereby subjected to various operations, which are a function of the transmission characteristics of the system. Linear system 11 provides an output signal y(t) which is passed as the measured signal, via an input 12, to RF unit 1. The measured signal is coupled to an input amplifier 13, which, preferably, is a controlled amplifier, which adapts this analog measured signal to the requirements of the subsequently following circuit components.

The amplified analog measured signal y(t) does still not represent the impulse response of the linear system, but it must be determined by correlation with the test signal. The measured signal is passed to a sampling circuit 1 (sample & hold or track & hold). Sampling circuit 17 determines the magnitude of the response signal at a particular point in time, and provides for the timely, stable, presentation of the determined value at the subsequent circuit units. Sampling circuit 17 is subject to the control of a sampling pulse, which is provided by a clock pulse divider 18. The sampling pulse is formed by dividing so the high frequency clock pulse, at a division ratio of $2^n$. The division ratio is selected so that sampling circuit 17 can be operated in the time span determined by the subsequent circuit elements, so as to ensure a correct further processing of the values at hand.

Sampling circuit 17 passes the sampled and held value of the measured signal at the time of sampling to an analog-digital converter 19. By using presently available circuit elements, the measuring speed of the entire circuit is substantially defined by the operational speed of analog-digital converter 19. The sampled pulse generated by clock pulse divider 18 must be selected so that the measured values which are passed to analog-digital converter 19 are held by sampling circuit 17 for a length of time that is required to convert the signal into a digital measured value in converter 19.

The rate of data capture (measured value sampling velocity) of the measuring circuit can solely be adapted by changing the division ratio of clock pulse divider 18. This makes it advantageously possible to combine a non-modified RF unit 1 with various external circuit units. In consideration of technological aspects, it is particularly useful to design all circuit units associated with RF unit 1 (clock pulse distribution 3, MLBS generator 4, signal conversion switch 7, output amplifier 8, input amplifier 13, sampling circuit 17, and clock pulse divider 18) as an integrated circuit, so as to allow a cost beneficial mass production. This integrated RF unit can then be combined with various external circuit units. When high accuracy and measuring speed are required for a measuring circuit, fast, but expensive, analog-digital converters can be employed. Should the requirements made of another device not be set as high, the RF unit can also be operated with cost beneficial converters. According to similar criteria, the other external circuit units can also be selected and combined with one and the same RF unit.

Subsequently, the digitized measured values are coupled to a fast math processor 20. The fast math processor 20 communicates with a fast storage 21, for example, a SRAM or a DRAM.

Fast math processor 20 adapts to the rate of conversion of the analog-digital converter to the processing speed of a subsequently arranged digital signal processor 22 (main processor). Since the sampling pulse is obtained with the division ratio of $2^n$ from the high frequency clock pulse, and the length of period of the MLBS is $2^m-1$, $2^m-\frac{1}{2}^n$ sampled values are obtained in a period, such that a complete set of digital measured values are obtained after $2^n$ periods of the MLBS.

The fast math processor thus adapts the high data capture rate of analog-digital converter 19 to the processing speed of digital signal processor 22. In a useful manner, this is done with averaging operations (averaging, exponential averaging, quadratic averaging or the like), so that no losses of data already captured arise. In this manner, a gain of dynamics, which can amount up to 10 lg p [dB], where p represents the amount of synchronous averages is achieved. A further function of fast math processor 20 is that it corrects systematic errors in the sampled values. For this purpose, one uses correction parameters which, for example, are embedded in storage 21. The magnitude of the correction parameters is determined by way of calibration measurements.

In the embodiment shown in FIG. 1, sampling circuit 17 is designed as return sampler. Fast math processor 20 passes digital measured values stored in storage 21 to a digital-analog converter 25, which couples an analog feedback signal to sampling circuit 17. While such a return sampler requires a higher circuitry effort, it presents a greater range of dynamics, since there needs to be determined, in the case of an applied feedback signal, respectively, only the change of the actual measured value with respect to the feedback signal. This also allows analog-digital converters having a lower resolution to be used, which thus affords a higher rate of sampling.

Figure 4:
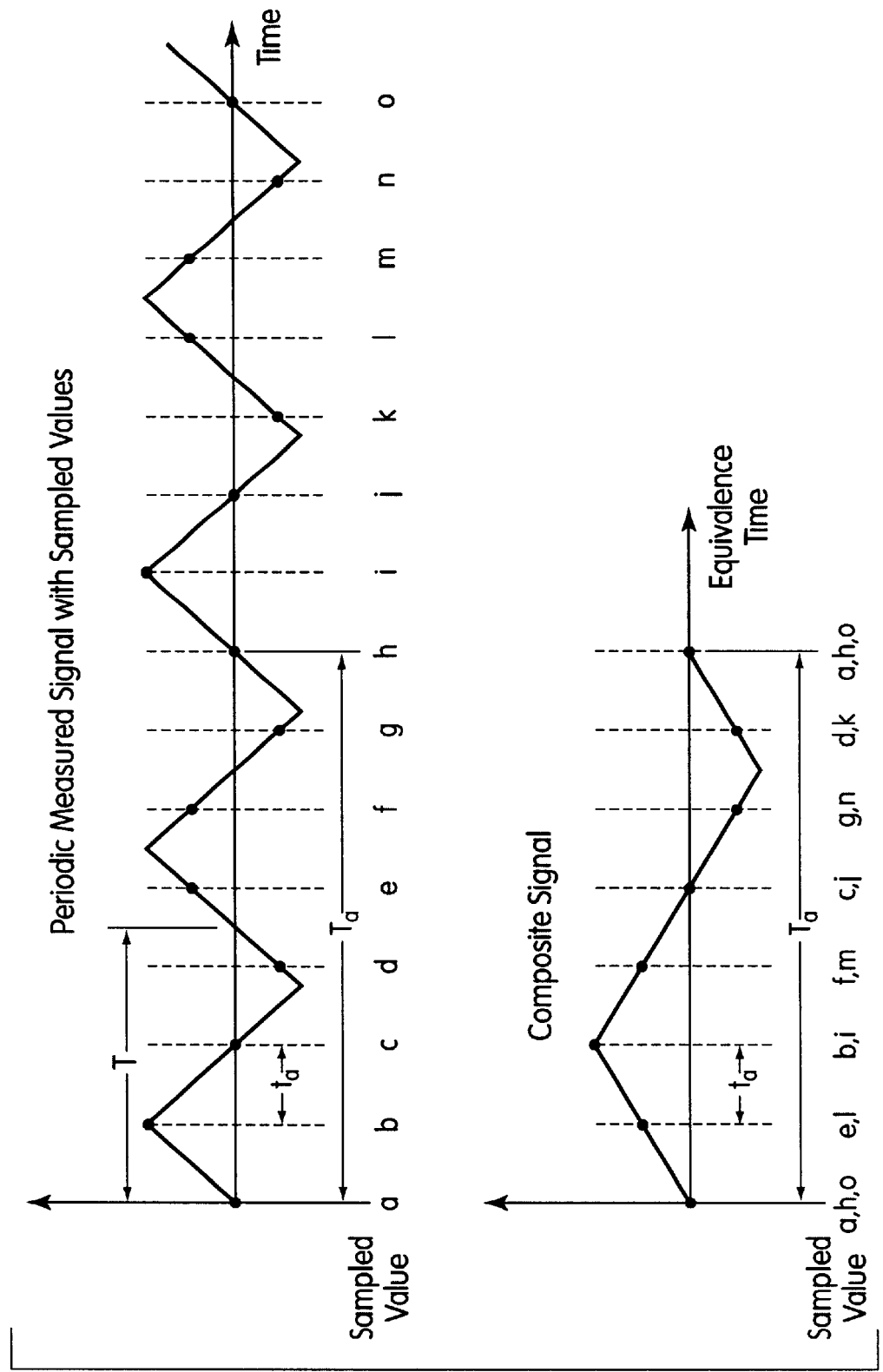
FIG. 4 diagrams of a periodic measured signal and an equivalent signal formed from sampling values.

For an improved understanding of the options of sampling, FIG. 4 shows a periodic measured signal and the equivalent signal derived from sampled values. In the upper diagram is drawn the amplitude shape of a possible periodic measured signal versus time. On the basis of the configuration in accordance with the invention it is possible within a period T of the measured signal emitted at the output of the linear system to obtain several sampled values. In the case represented by FIG. 4, during each period of duration, four sampled valued are taken. In the representation, the drawn sampled values are identified by lower case letters a to o. In the first period of the measured signal, accordingly, the sampled values a, b, c, and d are obtained. So as not to violate the sample theorem, in the second period of the measured signal, additional sampled values need to be obtained, namely, e, f, g, and h. A complete period of the sampling duration comprises for this sample, 2 periods of the measured signal. Under requirement of strict periodicity of the measured signal, further sampled values, which are obtained in subsequent periods, can be utilized to improve the measuring precision, since through averaging, possible interfering influences can be reduced. In the lower diagram of FIG. 4 is shown the composite signal obtained from the sampled values. The measured signal would be fully represented by the sampled values a to h. The further sampled values i to o serve to enhance the accuracy of the measuring precision.

The return of prior measured values to return sampler 17 mentioned with reference to FIG. 1 is possible and sensible with respect to principle under two aspects. A return provides for a gain in band width and dynamics, when through a suitable arrangement of the measured values in the storage, that a feedback signal is used having a value that is near to that of the measured signal. On the one hand, the immediately prior measured value of the immediately prior period can be used, since due to inter-linking between the high frequency clock pulse which controls the MLBS and the sampled pulse, the sampling of one period to the next period is carried out, and shifted exactly by the pulse rate $f_c$. If one represents the signal in a first period of the measured signal, obtained as a first sampled value, and the signal in the immediately following second period, obtained by the first sampled value in an equivalent signal period, then these two sampled values are separated only by an equivalent sampling period. The equivalent sampling period is selected so that the sampling theorem is satisfied. In sampling the measured signal of in FIG. 4, the sampled values of the first period are utilized as reference values for the sampling of the second period; sampled value a is a reference for sampled value e, and so on.

On the other hand, the advantages of a return sampler can be utilized in the averaging process over a plurality of periods, if one utilizes as feedback signal, that measured value which has been obtained at the same sampling point in time in a prior period. With reference to the case depicted in FIG. 4, sampled value a is reference for sampled value h, b is reference for i, and so on. In this case, it is sensible to store the determined and averaged, as required, sampled values in a ring storage, which has $2^m-1$ storage cells, so that a complete sampled period is stored in this ring storage. The two shown principles of the return sampling can also be employed in a combined manner.

In another embodiment, a sampling circuit can also be used without a return. In order to also attain an averaging of the measured values advantageously, in this case, a ring storage with $2^m-1$ storage cells can be used. Thus, within several measuring cycles the values associated with respect to one another are additively treated, and following a division by the number of cycles present, an averaged value for the respective sampling point in time is obtained.

The digital signal processor 22 receives the digital measured values from fast math processor 20, and carries out the further data processing. As has been described, with the test signal x(t) which is passed to the linear system under investigation is at hand, a MLBS x(t)=m(t). The measured signal y(t) obtained at the output of the linear system does not represent the impulse response of the system, but needs to be transformed into this value. This is done in digital signal processor 22, in which the cross correlation function ψmy(τ) between these two functions is determined. As a matter of principle, this occurs in accordance with the following equation:

$$\psi_{my}(\tau) = \int m(t+\tau) y(t) dt \qquad (4)$$

Since with the individual measured values, there are provided sampled values of periodic functions, equation (4) can be written in the following form as a matrix equation, here as an example with the shortest MLBS (m=2):

$$\psi_{my}(\tau) = [y_1 \; y_2 \; y_3] \cdot \begin{bmatrix} m(t+0) & m(t+1) & m(t+2) \\ -1 & 1 & 1 \\ 1 & -1 & 1 \\ 1 & 1 & -1 \end{bmatrix} \qquad (5)$$

This matrix product can be quickly calculated when, in a known manner, a Hadamard-matrix is carried out. This is referred to as Hadamard-transformation. Initially, the measured values have to be arranged so as to be in proper order. The Hadamard-transformation is then carried out in known manner. With respect to this, reference is made to the printed publication referred to in the introduction.

Digital signal processor 22 is also in communication with storage 21, in which are stored the required program instructions and/or individual measured values. Preferably, signal processor 22 carries out also a data reduction so as to minimize the data stream to the subsequent processing units.

The results of the Hadamard-transformation are passed from digital signal processor 22 to an interface unit 23, which provides the inter-linking to the further external data processing devices, such as, for example, a personal computer. Interface unit 23 and fast math processor 20 are preferably combined with a control logic 26 to a digital unit 27 (pre-processor) and, as required, integrated in a circuitry-technology manner. For synchronization, the control logic 26 also receives the sampled pulse from clock pulse divider 18.

When approaching the system on the basis that analog-digital converter 19 determines the dynamic range of the receiver side, the entire dynamics range of the measuring circuit is obtained in accordance with the following equation:

$$a[dB] = 6b \cdot 10 \; lg(p \cdot (2^m - 1)) = 6b + a_{SV} \qquad (6)$$

with b=effective Bits of AD-converter p=number of synchronous averages m=order of MLBS $a_{SV}$=Signal processing gain [dB].

The measuring time for the impulse response is:

$$T_{me\beta} \approx 2^m t 2^n p$$

With the foregoing equations, it can be seen that according to a respective utilization of the measuring circuit, the attainable dynamics and the circuitry dependent requirements pertaining to the analog-digital converter can be selected within relatively wide range limits.

The essential systematic errors, which appear in the described measuring circuit are material brought about by superposed effects pertaining to noise/interference and deviations of the test signal from the desired ideal form. The method in accordance with the invention is based on a strict clock pulse-accuracy of the system, and a stable periodicity of the test signal. Since these requirements need to be met by all components of the measuring circuit, additional, but stable, signal components such as voice-over components can be present in the measured signal. Within a period of a test signal, the condition of the system is changing constantly, so that the voice-over component varies. However the voice-over component can be determined by a reference measurement, during which a measurement without an applied test signal is carried out.

The deviations of the actual test signal from the ideal form can be determined by way of carrying out a reference measurement at a known measured object. The difference between the measured system behavior and the known system behavior of the known measuring object can be determined from the deviation between the actual test signal and the ideal form. The systematic errors determined in this manner can be eliminated from the actual measured signal in a known manner.

Figure 5:
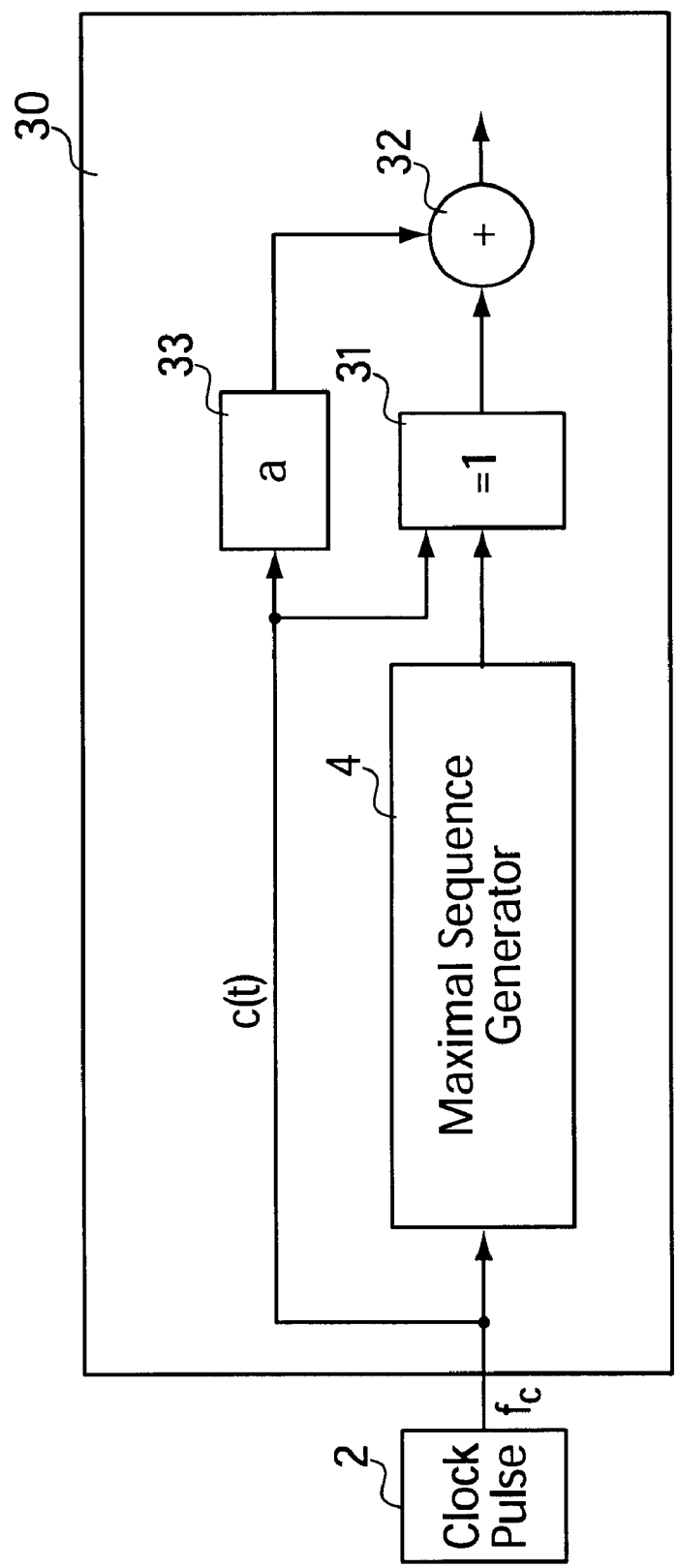
FIG. 5 a block circuit diagram of an enlarged MLBS generator for shifting the spectrum of a MLBS.

FIG. 5 shows a circuit block diagram of an expanded MLBS generator 30, which is employed in the case of a modified embodiment of the measuring circuit according to the invention. The core of the expanded MLBS generator 30 is the known MLBS generator which is triggered again by the clock pulse $f_c$. The known MLBS generator 4 provides the MLBS m(t), and passes it to a multiplier 31 which also receives the high frequency clock pulse. The product of high frequency clock pulse c(t) and the MLBS m(t) is passed to an adder 32. Simultaneously, adder 32 receives the high frequency clock pulse which, via a damping circuit 33, has been brought to a damped high frequency clock pulse, dampened by a, and referred to by the function c(t). The high frequency clock pulse provides, a carrier signal c(t) onto which is pressed the MLBS m(t). The modified MLBS n(t) results under the following equation:

$$n(t)=m(t) \cdot c(t)+a \cdot c(t) \qquad (7)$$

The circuit indicated in FIG. 5 can be entirely configured with digital circuit components and a resistance network, so that it can be integrated with RF unit 1. The expanded MLBS generator 30 provides a test signal in which the spectrum of the MLBS is shifted to higher frequencies.

In order to obtain measuring results which are meaningful, one has to ensure that the sampling theorem is satisfied. The transfer function of the linear system subject to investigation must be limited to the frequency range of 0 to $f_c/2$ When very broad band systems are to be investigated, MLBSs need to be at hand which were prepared with a very high rate of clock pulse rate $f_c$. This requirement also applies also narrow band systems which operate in a very high frequency range. The technical realization of MLBSs produced with a very high of clock pulse generation is, however, difficult.

This problem is solved through the shifting of the spectrum of the MLBS to higher frequencies as has been described with reference to FIG. 5. This embodiment of the method can be applied to band pass systems which do not operate at low frequencies. Such systems do not need the low frequency spectral components of the clock pulse.

Figure 6:
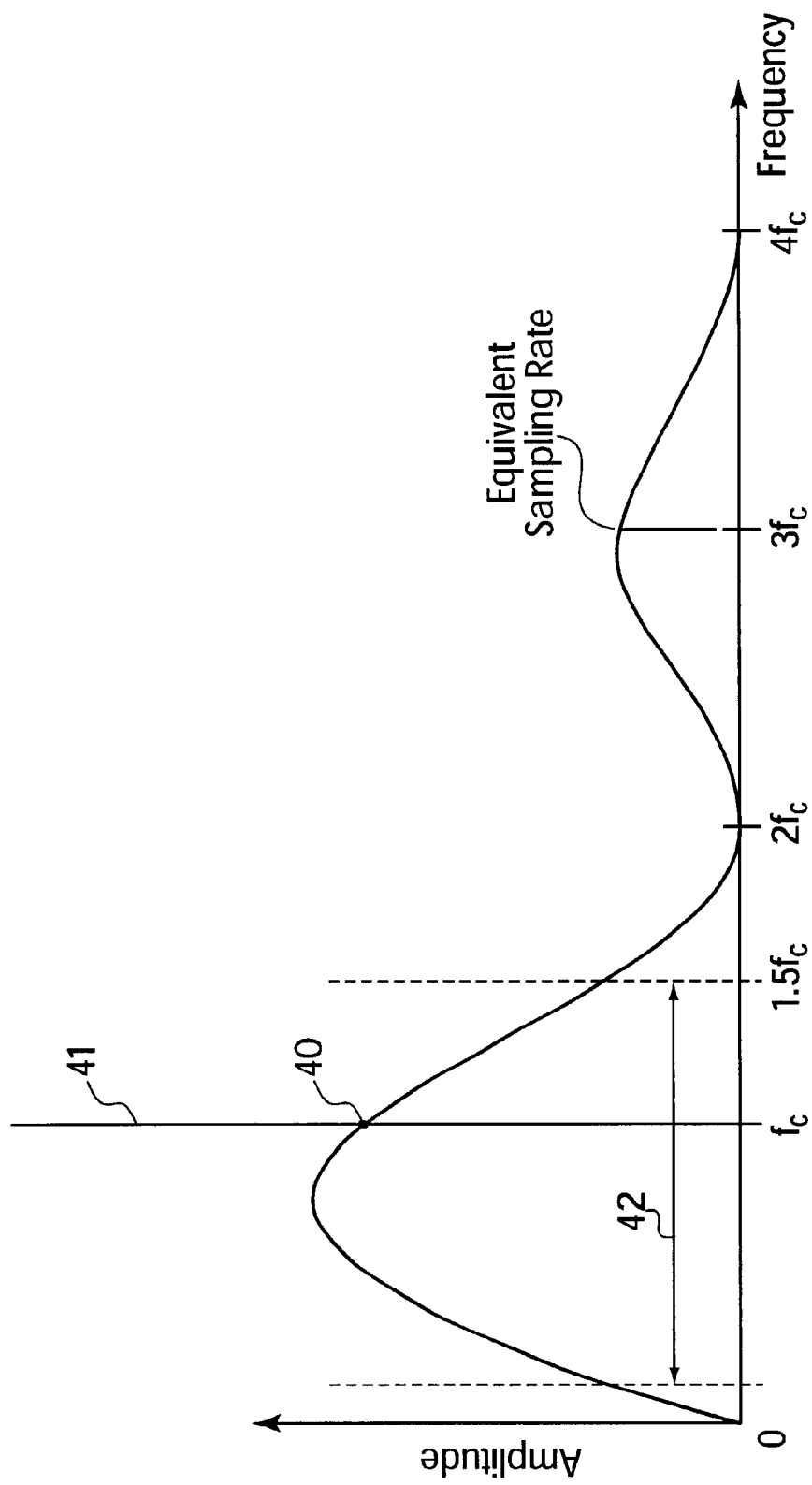
FIG. 6 a diagram of a Huell curve of the spectrum of a modified MLBS.

FIG. 6 shows a diagram of the envelope of the spectrum of the modified MLBS n(t). The envelope is shifted with respect to the envelope of a known MLBS, since it has been impressed onto a carrier signal of high frequency. With the frequency $f_c$ the spectrum has a singular range. Depending on the selection of the damping constant a, the spectrum can be increased or decreased at this position. It is particularly appropriate that the damping constant a is selected so that a continuous course of the envelope arises. In FIG. 6, upon selection of an optimal damping constant a, the point of the singularity is identified with the reference numeral 40. Line 41 represents the singular range at the frequency $f_c$. The equivalent sampling rate can now be fixed at 3 $f_c$, for example. This selection can, be realized in a simple manner with digital control elements. Instead of the division ratio $2^n$ a division ratio $3:2^n$ is now used to generate the sampled pulse from the high frequency clock pulse. The transfer function of the system to be measured can be present in a useful range of $0.2f_c$ to $1.5f_c$. The useful range is also shown by reference numeral 42 in FIG. 6.

In order to determine in the last mentioned embodiment, the impulse response from the measured signal, as in the case of the method first described, in which the MLBS is applied without carrier signal to the input of the system under investigation, a cross correlation signed has to be determined between the modified MLBS and the measured signal. Just as in the case of the first described method, the correlation can be represented as a matrix equation. The following is a simple case which will clarify the principle of the signal course, and the pertaining treatment instructions for the obtained data.

Figure 7:
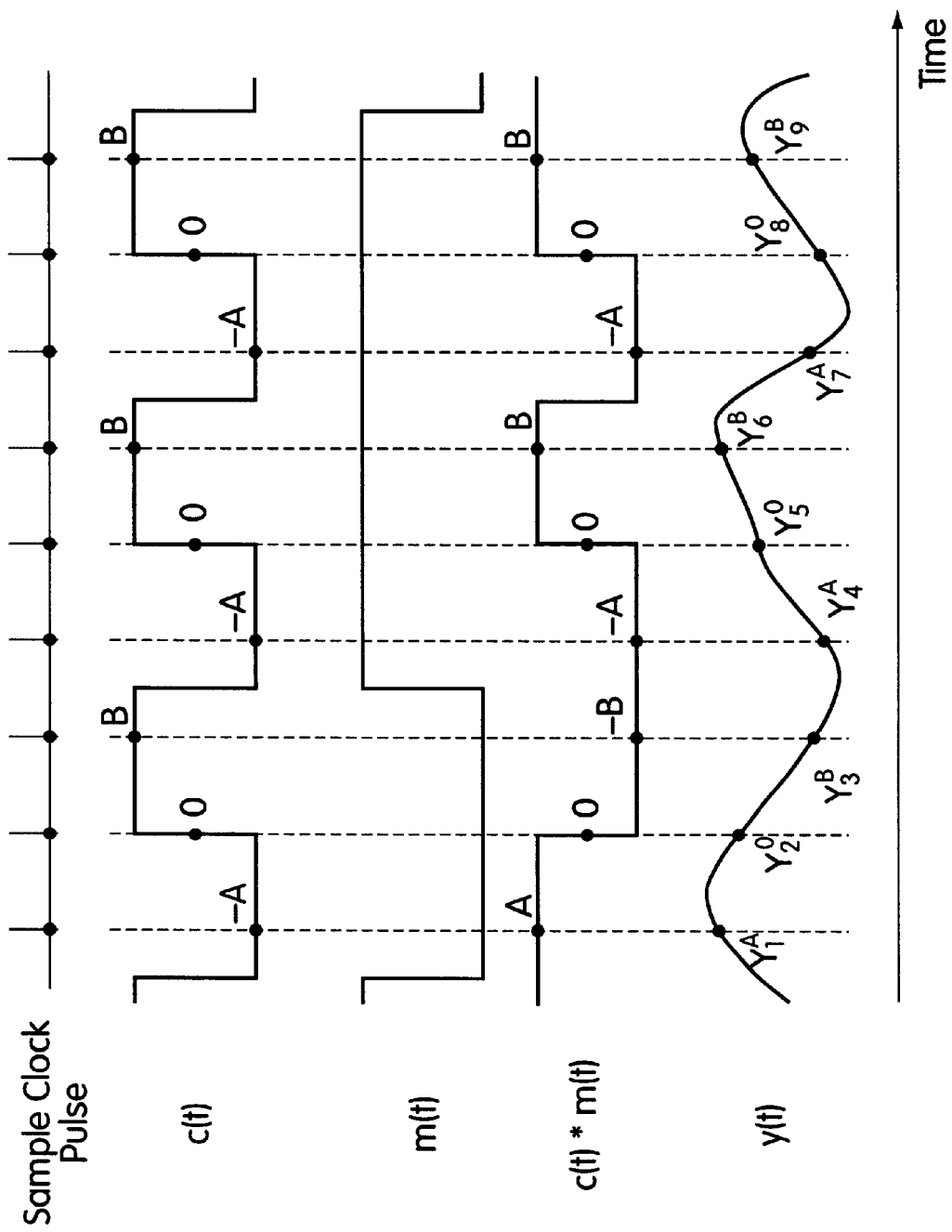
FIG. 7 is a representation of the time wise signal course under utilization of the modified MLBS.

In FIG. 7 shows the time wise plot of the signals of interest over a period of the MLBS m(t). In the upper line are drawn the time points at which a sampling occurs. The fact that the sampled pulses are determined not during one period, but over $2^n$ periods, is not crucial. The sampled values obtained over several periods are arranged in correct order so they can be considered as if they were obtained within one period. The second line represents the high frequency clock pulse signal c(t) in its time wise plot, whereby the values are labeled with reference to the individual sampling time points. The sampling time points were selected in the example shown so that each third sampling is positioned on a edge of the clock pulse signal such that this has the signal value of 0. In the third line is shown the course of the MLBS m(t) over a period. The fourth line shows the signal course of the product c(t).m(t), whereby, the individual signal values are labeled. In the lower line is shown the course of the measured signal y(t) given by the system to be investigated. At the time, points of sampling individual data values $y_1^A, Y_2^O, y_3^B, \ldots$ are determined. For reasons of clarity, all signal values are sequentially arranged to the groups A, 0, and B, one following another.

Figure 8:
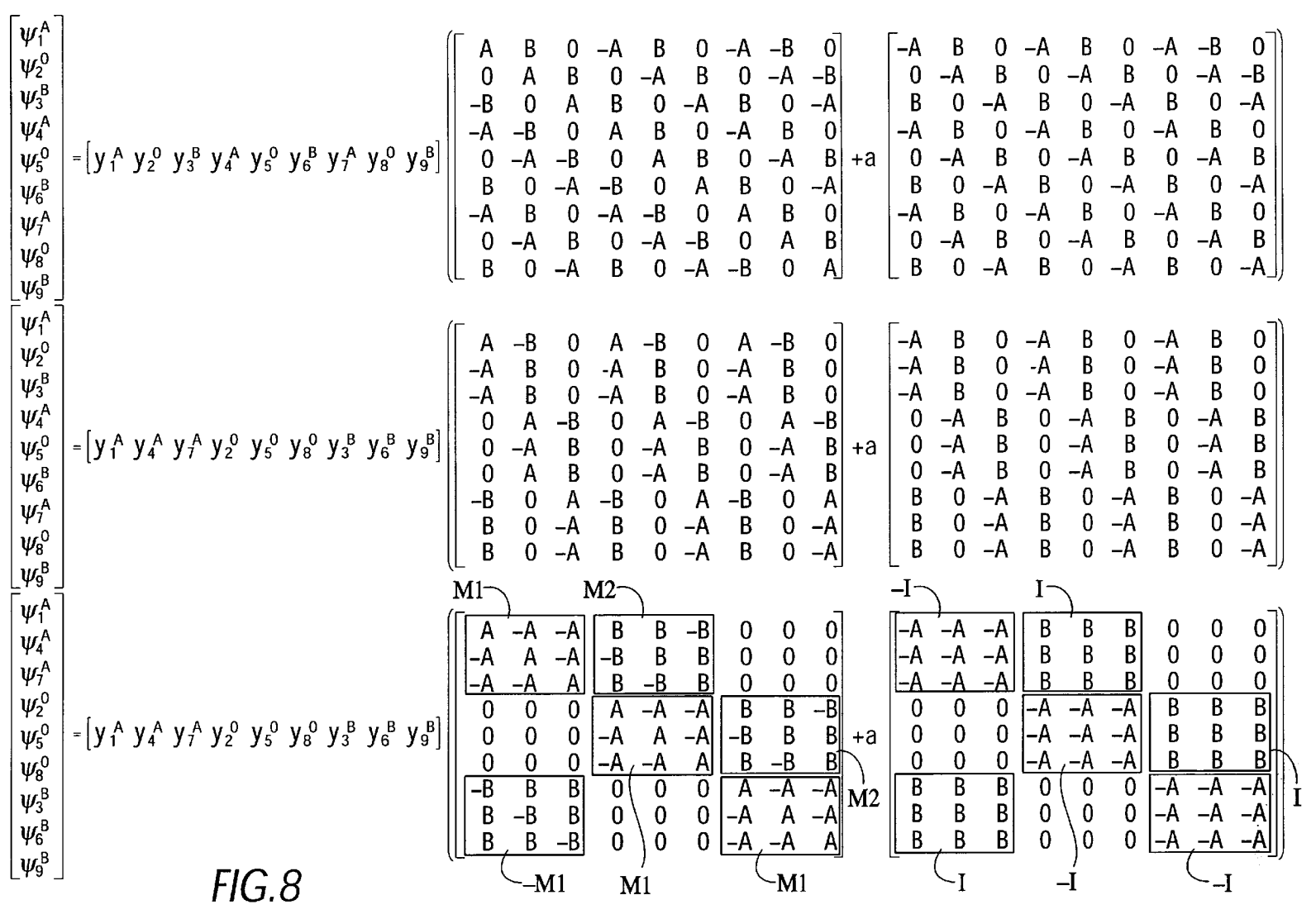

FIG. 8 shows the resulting matrix equation with respect to the signals and sampling points in time shown in FIG. 7. A complete set of data for calculating the complete impulse response is now comprised of $3.(2^m-1)$ sampled values.

The upper matrix equation in FIG. 8 corresponds to the signals shown in FIG. 7 after the sampled values obtained over several periods are arranged in correct order. The computing effort for solving this matrix equation would be unjustifiably great, since the fast Hadamard-transformation is not applicable to such matrixes. In order to apply the Hadamard-transformation, a re-sorting of the sampled values into the matrices is necessary. Thus, as a first step, the lines of the matrices are bunched into groups of three. The use of the grouping criterion "3" is in direct relation to the factor "3" with which the division ratio $2^n$ for the production of the sampled pulse is multiplied, when the MLBS is impressed upon the carrier signal. In order to realize the method in digital control-technology, this factor should be a natural number. In the case of modified forms, for example, the factors "5" or, respectively "7" can also be employed. When the factors are greater, the data processing effort is increased, such that, advantageously, the factor "3" has been used.

To re-sort the matrices, the respectively first line of the group of three of the matrix lines is shifted. The first line of the second group is shifted to the second line of the newly ordered matrices, while the first line of the third group is shifted to the third line. Then, the second line of the first group will then be the fourth line of the newly ordered matrix, which simultaneously represents the first line of the second group of three in the new matrix. The second line of the second group of three in the new matrix results from the second line of the second group of three of the original matrix, while the third line of the second group of three corresponds to the second line of the third group of the original matrix. This shift algorithm is carried out with all lines of the original matrix. The result is shown as a second matrix equation in FIG. 8. So that the equation is valid in the following, the individual values of the vector of the measured signal also have to be resorted, as is also shown in FIG. 8. The sampled values are also arranged in groups of three, whereby always the first, the second or, respectively, the third value of each group of three is bunched in the second equation shown in FIG. 8.

In the next re-sorting step, there is performed a further re-sorting of the values contained in the matrices, whereby this time, the columns are gathered in groups of three. Otherwise, the sort algorithm corresponds to the one described with respect to the lines. The result is shown in FIG. 8 as the third equation. In the two matrices sub-matrices can now be bunched which, respectively, comprise three lines and three columns. Individual sub-matrices are shown in FIG. 8 by way of an additional frame. Each of the individual matrix result in six sub-matrices, which contain the relevant sampled values, and three sub-matrices, which contain only the value 0 and, accordingly, need not be considered in the further data processing. The six relevant sub-matrices of the lowermost matrix can now be subjected to a known Hadamard-transformation. An additional simplification results therefrom in that a sub-matrix M2 is converted into a sub-matrix –M1 when the third column of the sub-matrix M2 is shifted to the position of the first column, and the two remaining columns are moved to positions two and three. The six sub-matrices of the right hand matrix indicate that only all measured values A, 0, or B are to be added. Upon completion of all matrix operations, the resultant vectors are to be ordered into their natural sequence and provide the impulse response which is to be determined.

Figure 9:
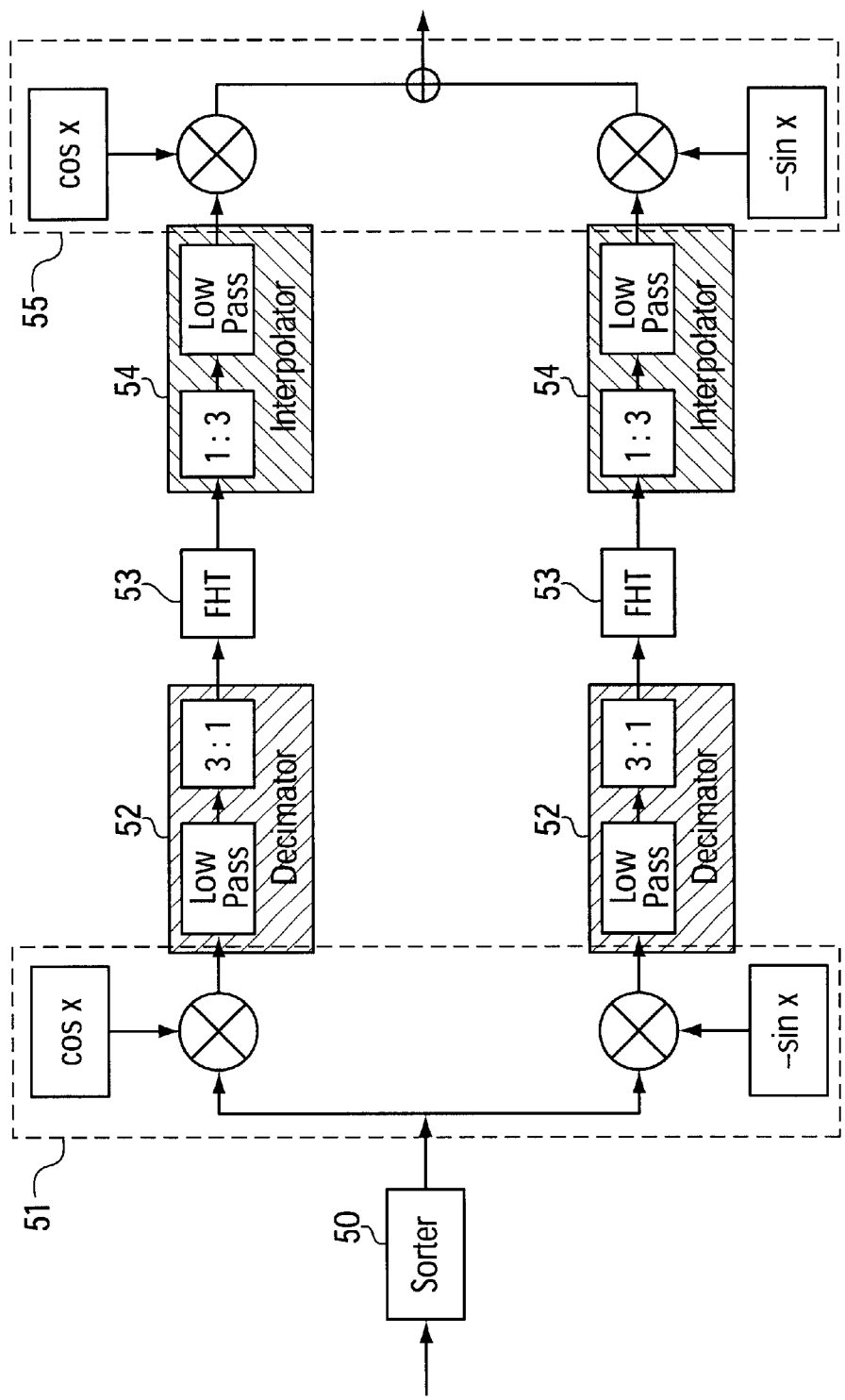
FIG. 9 is a circuit block diagram of a data processing section/portion for measured data processing under utilization of a modified MLBS.

In the case where the spectrum of the measured signal y(t) is limited to $0.5f_c \ldots 1.5f_c$, FIG. 9 shows a data processing section for measured values processing under utilization of the modified MLBS. The digitized and, as required, for an averaging formation subjected sampled values are passed to a sorter 50, which, can be integrated in the digital signal processor. In sorter 50, the sampled values are arranged in their natural order so that a real band pass signal is obtained, the spectrum of which is a compressed representation of the original spectrum. The data are subsequently passed to a first quadrature modulator 51, which forms from these an analytical low pass signal, separates this into a real component and an imaginary component, and passes these two components, respectively, to an associated decimator or data reduction unit 52. The decimator carries out data reductions wherein only ⅔ of the valid spectral range are actually provided with the measured values. The relevant data are subjected subsequently to the Hadamard-transformation 53. By way of an interpolator 54, after the Hadamard-transformation, the original data extent is reestablished, such that in the subsequent second quadrature modulator 55 from the components of the complex signal, there is formed again a real signal, the course of which corresponds to the cross-correlation between the measured signal and the test signal.

Figure 10:
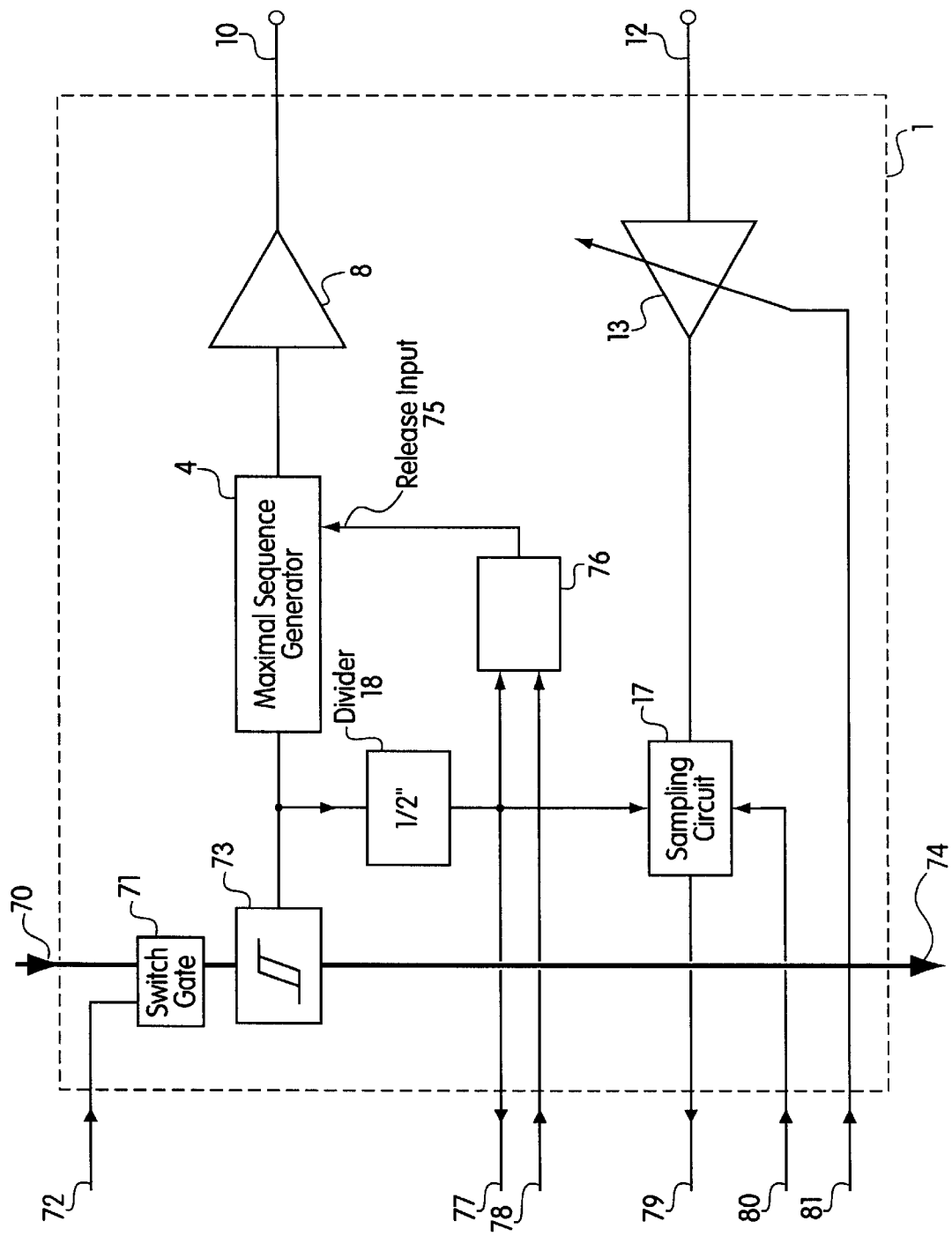
FIG. 10 is a block circuit diagram of the possible configuration/architecture of an integrate high frequency component-configuration group.

FIG. 10 shows a circuit block diagram of a possible embodiment of an integrated high frequency group 1 (RF unit). The individual component groups of RF unit 1 are digitally configured, which allows a simple integration. It is the aim of this integrated solution, to allow for the use of standard RF parts in a multichannel measuring apparatus. The high frequency clock pulse $f_c$ is passed to the RF unit at an input 70 The frequency $f_c$ of the high frequency clock pulse can be adapted to the specific measuring purpose. The clock pulse $f_c$ is further passed through a switch gate 71, which receives a control signal from a clock pulse switch input 72 and, in its open condition, passes the clock pulse to the other components. In order to ensure that clean control edges are obtained, the clock pulse $f_c$ passes through a clock pulse regeneration unit 73. By the clock pulse regeneration unit 73 the clock pulse is passed in distributed manner to MLBS generator 4, clock pulse divider 18, and to a clock pulse output 74. Furthermore, in the RF unit is integrated output amplifier 8 which, in the embodiment shown here, receives directly the MLBS from the MLBS generator 4. A signal converter is not present here. Instead, MLBS generator 4 has a release input 75 which receives a start/stop signal from a synchronization circuit 76. Clock pulse divider 18 provides the sampled pulse, by way of division in the ratio of $1:2^n$ of the high frequency clock pulse $f_c$, and passes it to the synchronization circuit 76, and to a sampler output 77. The ratio of the division of the pulse divider is preferably adjustable so as to prepare, in the event of a modified high frequency clock pulse, the specific sampled pulse required in the other component groups. The generation of the start/stop signal for the MLBS generator 4 is carried out in synchronization circuit 76, in response to an external start/stop signal, which is passed to the RF unit by way of a start/stop input 78. The amplified MLBS is passed to the test signal output 10 of the RF unit. Input amplifier 13 is also integrated with the RF unit and it receives the measured signal at input 12. The amplified measured signal is passed to the sampling circuit 17. Sampling circuit 17 provides the sampled measured value, at a measured value output 79, in stable form. Since the embodiment shown utilizes a sampling circuit with return, via a return input 80, a preceding sampled value is passed to the sampling circuit. There is further provided an amplifier control input 81 with which the amplification of input amplifier 13 can be controlled.

In order to provide a rather simple cascading of several RF units, only few RF connections are present between the individual RF units, so as to reduce interferences. It is desirable that control signals and the like contain a low time delay so one can make use of uncomplicated control electronics components. Critical signals with respect to time are the high frequency clock pulse, the sample pulse, a synchronization signal with which the commencement of a new MLBS is fixed, as well as the test signal, and the measured signal. Since in accordance with the suggested embodiment RF unit 1 is configured as integrated circuit element, this element can be arranged in the immediate vicinity of a RF sensor (for example, an antenna), such that nearly no problems arise with respect to the test signal and the measured signal. When using the control principle shown in FIG. 10 is used, the only critical signal line that remains is the clock pulse signal line, which extends between the RF unit, between clock pulse input 70 and clock pulse output 74, and wherein the line needs to extend from one integrated RF unit to the next integrated RF unit.

Figure 11:
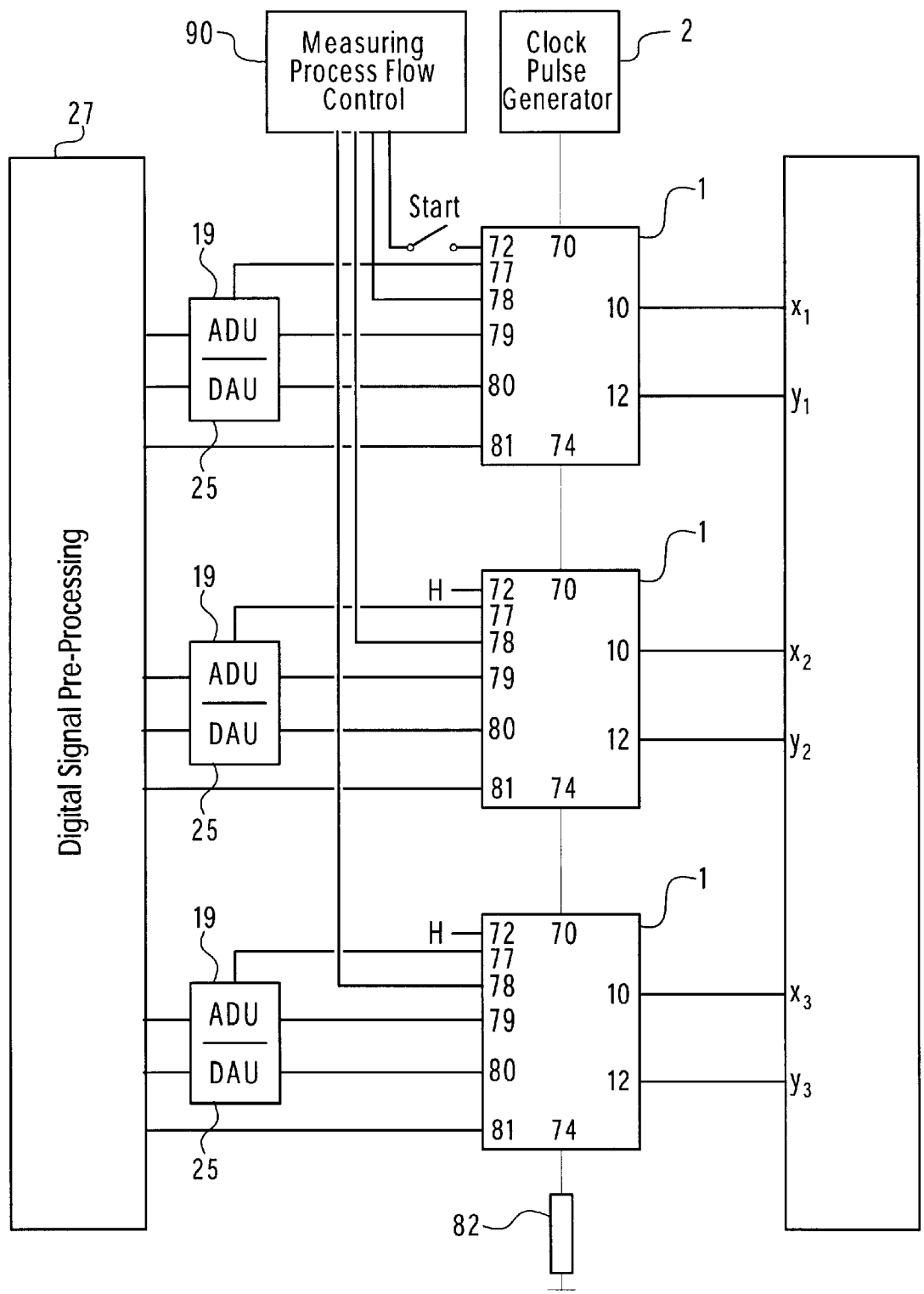
FIG. 11 is a block circuit diagram of a measuring arrangement with several high frequency component-configuration groups.
Figure 1:
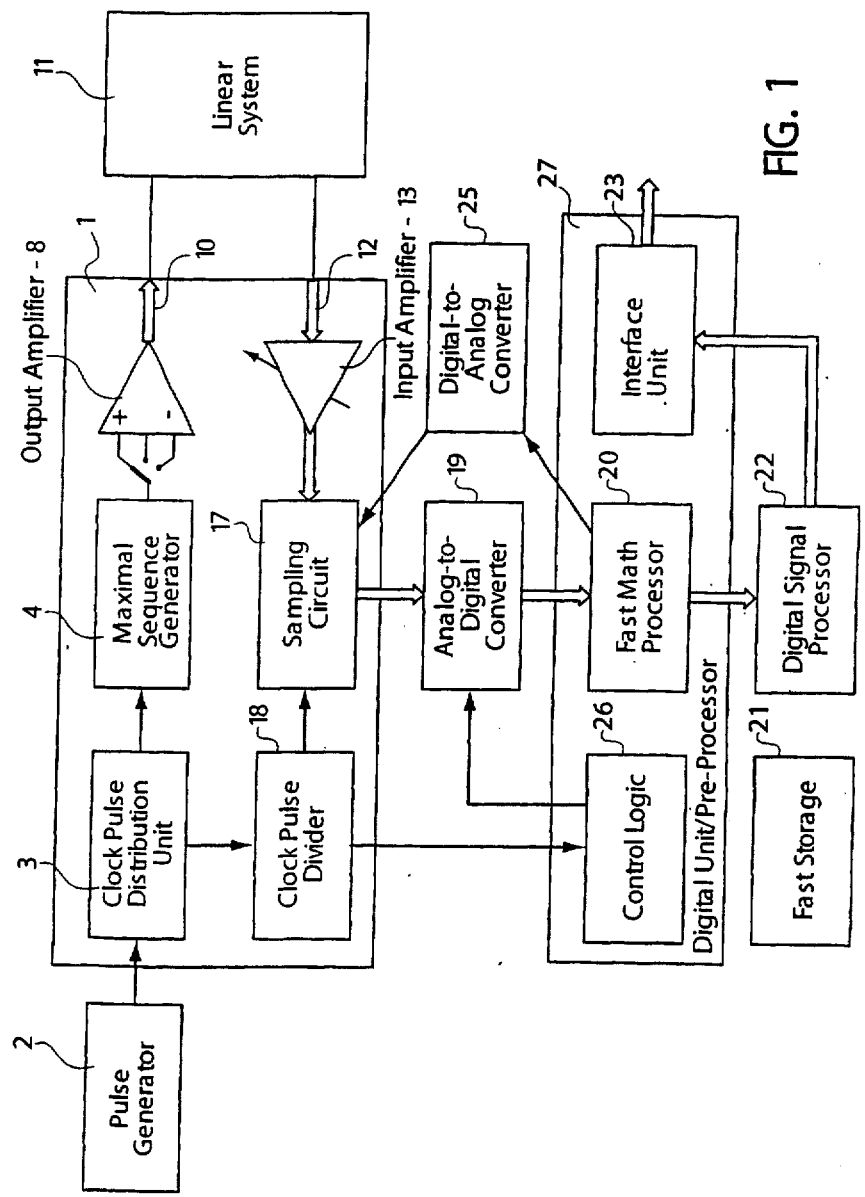
Figure 3:
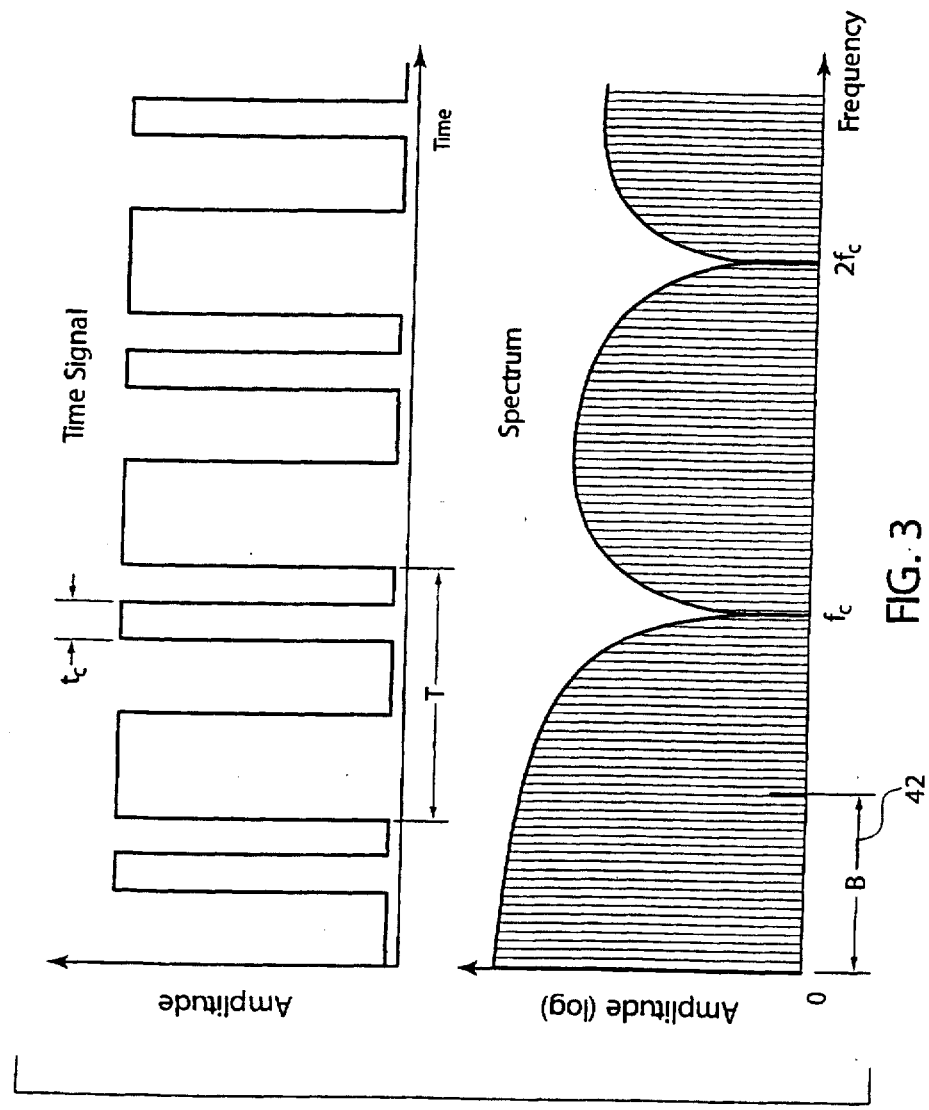
Figure 4:
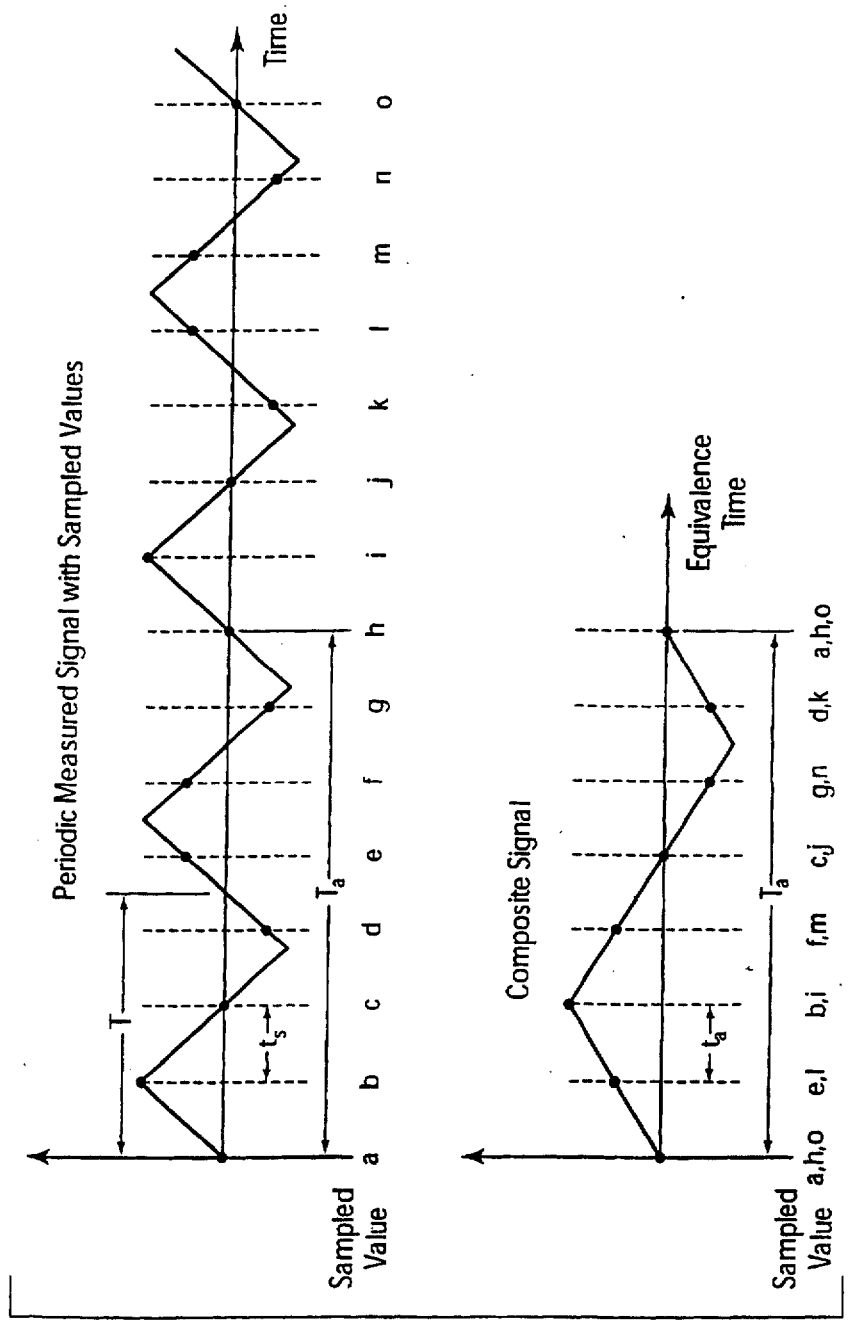
Figure 10:
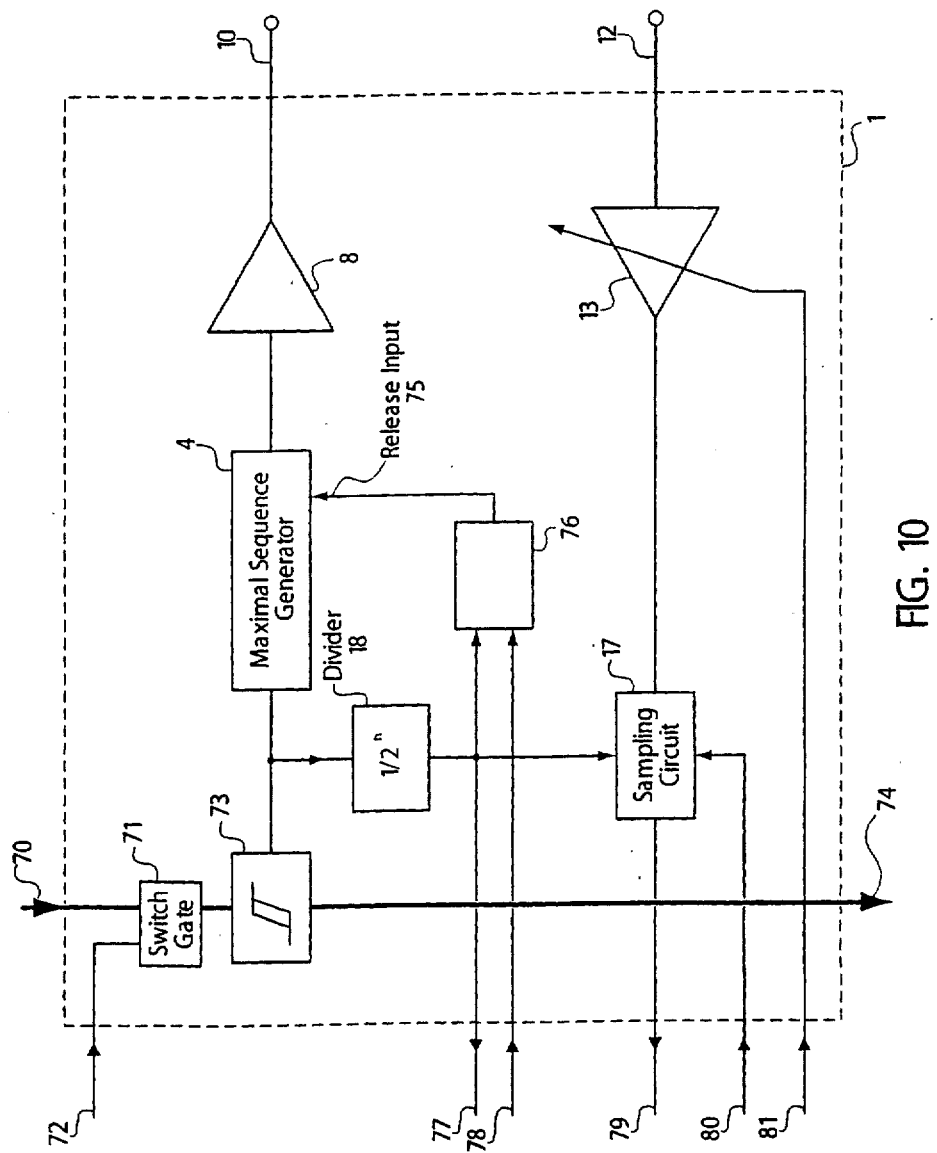

FIG. 11 shows a circuit block diagram of an embodiment of invention using several like similar high frequency circuits 1 (RF units). In the example presented, a linear system 11 with three inputs $x_1$, $x_2$, and $x_3$, as well as three outputs $y_1$, $y_2$, and $y_3$, is to be investigated by introducing test signals and evaluating the produced output signals. Thus, three RF units 1 are used which, respectively, provide MLBSs at the inputs of the system 11. All three high frequency component groups 1 are supplied with a high frequency clock pulse $f_c$ from a common clock pulse generator 2. As is described with reference to FIG. 10, the clock pulse is passed through each RF unit such that the bold drawn clock pulse path line presents the sole synchronization line of the circuit. At the end of this path is provided a terminal resistance 82.

With each RF unit 1 is associated an analog-digital converter 19, which passes the digitized sampled values to a common digitizing unit 27 and a digital signal processor, (not shown in this drawing figure). In like manner, with each RF unit is associated a digital-analog converter 25 which provides the feedback signals to the respective return input 80. Additionally a measuring process flow control 90 is provided which is effective, via the start/stop inputs 78 to the individual RF units 1. The measuring process flow control 90 has a coupling, not shown, to control logic 26, and to the common signal processor 22, so as to react in response to the command instructions of these control units. When an embodiment with signal conversion switches/circuitry is utilized, the measuring process flow control is also taking care of the control of the signal converter switches/circuitry.

As is shown in FIG. 10, in front of clock pulse regenerator 31 a switch gate 71 is provided which is subject to control by the clock pulse switch input 72. In this case, control gate 71 is open, such that the clock pulse signal is directly passed through. Only the first RF unit in the chain arrangement receives a control signal from the measuring process flow control 90, via the clock pulse switch input 72 through which gate 1 is opened for a defined point in time of commencement of measuring. Delays to which the clock pulse signal is subjected during the signal course through the sequentially arranged RF units can be eliminated, by calculation, with use of a calibration measurement from the measured result, such that they do not negatively impact the precision of the measuring result.

As is shown in FIG. 11, several channels can be connected to a common digitizing unit. When high data rates are desired, one can connect to each measuring channel a respective pre-processor. As required, also several digital signal processors can be operated in parallel, which further enhances the operational speed.

In order to take measurements at so-called MiMo systems (multi input, multi output), it is necessary that the test signals applied at the various inputs be largely non-correlated. When use is made, such as in the example at hand, of MLBSs of same length as test signals, they are always correlated to one another so that a simultaneous excitation of all inputs would not be permissible. So that the method according to the invention can be used also with such systems, the polarity of the test signals at the individual inputs of the system to be investigated need to be changed in an appropriate time regime. In the embodiment shown in FIG. 1, for this purpose, the signal converter switches 7 are integrated with each RF unit. The signal converter switch allows the delivery of the MLBS with positive or negative polarity and has a third control position during which no test signal is emanating from the RF unit. The last mentioned function can also be carried out through the off condition of the MLBS generator, with the aid of a start/stop input as is done in the embodiments in accordance with drawing FIGS. 9 and 10.

In the following the control of the conversion function of the signal converters or, respectively, the start/stop signals are disclosed. For this, a system is considered which has K inputs at which are applied test signals $x_k(t)$ wherein k=1 ... K. The measured signals taken at the L outputs of the system are $y_l(t)$ wherein l=1 ... L. The individual signals can be written as vectors as shown in the following:

$$x(t) = \begin{bmatrix} x_1(t) \\ x_2(t) \\ x_3(t) \\ \vdots \\ x_K(t) \end{bmatrix} \quad (8)$$

$$y(t) = \begin{bmatrix} y_1(t) \\ y_2(t) \\ y_3(t) \\ \vdots \\ y_L(t) \end{bmatrix} \quad (9)$$

There will then be preferred at least K measurements, whereby other combinations of the test signals at the inputs are applied. All test signals and all measured signals are arranged in matrices:

$$u(t) = [x^{(1)}(t) \; x^{(2)}(t) \; x^{(3)}(t) \; \cdots \; x^{(K)}(t)] = \quad (10)$$
$$\begin{bmatrix} x_{11}(t) & x_{12}(t) & \cdots & x_{1K}(t) \\ x_{21}(t) & x_{22}(t) & \cdots & x_{2K}(t) \\ \vdots & \vdots & \ddots & \vdots \\ x_{K1}(t) & x_{K2}(t) & \cdots & x_{KK}(t) \end{bmatrix}$$

$$v(t) = [y^{(1)}(t) \; y^{(2)}(t) \; y^{(3)}(t) \; \cdots \; y^{(K)}(t)] = \quad (11)$$
$$\begin{bmatrix} y_{11}(t) & y_{12}(t) & \cdots & y_{1K}(t) \\ y_{21}(t) & y_{22}(t) & \cdots & y_{2K}(t) \\ \vdots & \vdots & \ddots & \vdots \\ y_{L1}(t) & y_{L2}(t) & \cdots & y_{LK}(t) \end{bmatrix}$$

In this u(t) is the test signal matrix and v(t) the measured signal matrix, from which the two correlation matrices $\psi uu(t)$ and $\psi uv(\tau)$ are calculated:

$$\psi_{uu}(\tau) = \int u(t) u^T(t+\tau) dt \quad (12)$$

$$\psi_{uv}(\tau) = \int v(t) u^T(t+\tau) dt \quad (13)$$

The convolution of these two matrices provides the desired matrix of the impulse response g(t) of the system which is being investigated.

$$\psi_{uv}(t) = \int g(\tau)\psi_{uu}(t-\tau)d\tau \quad (14)$$

To determine of the individual impulse responses, equation (14) must be rearranged according to g(t), which, with justifiable effort, is only possible when the test signals are select in suitable manner. The utilized test signals are optimally adapted to one another when their correlation matrix is a diagonal matrix, the diagonal elements of which are Dirac functions.

$$\psi_{uu,opt}(\tau) = \delta(\tau) \cdot D \quad (15)$$

$$\text{with } D = \begin{bmatrix} \sum_{K}^{K} x_{1,\text{eff}}^2 & 0 & \cdots & 0 \\ 0 & \sum_{K}^{K} x_{2,\text{eff}}^2 & \cdots & 0 \\ \vdots & \vdots & \ddots & \vdots \\ 0 & 0 & \cdots & \sum_{K}^{K} x_{K,\text{eff}}^2 \end{bmatrix}$$

$$\sum^{K} x_{k,\text{eff}}^2$$

Is the sum of the output test signal K applied test signals.

As for the amount K of the inputs of the system to be measured, a Hadamard-matrix exists, and it is possible, under exclusive use of identical MLBS m(t), to form an optimal correlation matrix ψuu,opt (t) (translator's note: here please include the symbols on line 20, page 36 of the german text) of the test signals. It is necessary in such a case for the K measurements to vary the polarity of the MLBSs as a function of the formation instruction of a Hadamard-matrix.

The following is an example of measuring a system with two inputs and three outputs, whereby it will be shown how the signal converter of the three to be used high frequency constructive groups are to be controlled. The exemplary system is characterized by six pulse responses $g_{kl}$(t). For the case where simultaneously two signals are available at the input, the output signals can result as a folded product, as follows;

$$\begin{bmatrix} y_1(t) \\ y_2(t) \\ y_3(t) \end{bmatrix} = \begin{bmatrix} g_{11}(t) & g_{12}(t) \\ g_{21}(t) & g_{22}(t) \\ g_{31}(t) & g_{32}(t) \end{bmatrix} * \begin{bmatrix} x_1(t) \\ x_2(t) \end{bmatrix} \quad (16)$$

If subsequently a second (third . . .) time, signals are applied, there exist a dependence on the time, thus it means: (the function of time is taken for granted).

$$\begin{bmatrix} y_{11} & y_{12} \\ y_{21} & y_{22} \\ y_{31} & y_{32} \end{bmatrix} = \begin{bmatrix} g_{11} & g_{12} \\ g_{21} & g_{22} \\ g_{31} & g_{32} \end{bmatrix} * \begin{bmatrix} x_{11} & x_{12} \\ x_{21} & x_{22} \end{bmatrix} \quad (17)$$

↑ ↑    ↑    ↑ ↑
1. measurement / 2. measurement   The system doesn't change characteristics   1. measurement / 2. measurement Under the pre-requisite that as test signals, MLBSs m(t) at all inputs, are used which are applied with positive and negative (inverted) polarity, or turned off, the excitation matrix characterized in equation (17) can be written as follows:

$$\begin{bmatrix} x_{11} & x_{12} \\ x_{21} & x_{22} \end{bmatrix} = m(t) \cdot \begin{bmatrix} a_{11} & a_{12} \\ a_{21} & a_{22} \end{bmatrix} \text{ With } a_{ij} \in \{-1, 0, 1\} \quad (18)$$

Rewriting the equations (17) and (18) in matrix form, there is obtained:

$$v(t) = g(t) * u(t) \quad (19)$$

$$u(t) = m(t) \cdot A \quad (20)$$

A is the control matrix in which the control conditions for the signal converters in the individual high frequency component groups are contained.

In the next step from equation (19) the cross correlation formed as follows:

$$\psi_{vu}(\tau) = \int v(t) \cdot u^T(t+\tau)dt = g(t) * \int u(t) \cdot u^T(t+\tau)dt \quad (21)$$

whereby $$\int u(t) \cdot u^T(t+\tau)dt = A \cdot A^T \cdot \int m(t) \cdot m(t+\tau)d\tau$$
$$\approx A \cdot A^T \cdot \delta(\tau)$$

Which results in $$\psi_{vu}(\tau) \approx g(\tau) \cdot A \cdot A^T \quad (22)$$

Whereby, $\psi_{vu}(\tau)$ can be calculated from the measured values, while g(τ) is sought. On regrouping of equation (22) there is obtained:

$$g(\tau) \approx \psi_{vu}(\tau) \cdot (A \cdot A^T)^{-1} \quad (23)$$

A pre-requisite for the regrouping is that $A \cdot A^T$ is not a singular entity. The best results are achieved in a measurement to be carried out when:

$$A \cdot A^T = D \quad (24)$$

Whereby D is a diagonal matrix or in general if A is an orthogonal matrix.

This condition is, for example, satisfied when during each measurement only one MLBS is applied at an input, so that the control matrix A for a system with four inputs is configured as follows:

$$A = \begin{bmatrix} 1 & 0 & 0 & 0 \\ 0 & 1 & 0 & 0 \\ 0 & 0 & 1 & 0 \\ 0 & 0 & 0 & 1 \end{bmatrix} = D = I \quad (25)$$

In the configuration of the system, in which only at an input of the multichannel linear system, a test signal is applied, has the particular advantage that a defined commencement of the test signal can be determined, as follows. The MLBS which is to be used as a test signal is to be started with the accuracy of the leading edge of a clock pulse edge of the high frequency clock pulse. In order so as to configure the control of the measuring process with classical digital circuitry technology, particular solutions are required, since the aforementioned requirement can not be satisfied by known control circuitry. Thus, in FIG. 10, the start/stop signal is passed from synchronization circuit 76 to a release input 75 of MLBS generator 4. Since the sampling clock is directly derived from the high frequency clock pulse, it has the same precision, such that the sampled pulse can be used as a control pulse for the synchronization control circuit 76 which passes the start/stop signal only at an exactly predetermined point in time to the MLBS generator 4. The control signal passed from the outside, via a start/stop input 78, can, accordingly, swing in, between two sampled pulses, to a stable condition. As a swing-in time is at hand, a time range up to the length of the period duration of the sampled pulse, is possible such that one can use common digital control technology.

In the event that MLBSs are to be applied at all inputs, there needs to be varied during each measurement, the polarization of the MLBS. For this, it is particularly advantageous when the control matrix is a Hadamard-matrix. Where four inputs are available in a system to be investigated, the control matrix is as follows:

$$A = H(4) = \begin{bmatrix} 1 & -1 & -1 & 1 \\ 1 & 1 & -1 & -1 \\ 1 & -1 & 1 & -1 \\ 1 & 1 & 1 & 1 \end{bmatrix} \quad (26)$$

whereby $A \cdot A^T = D = 4 \cdot I$ where I is the identity matrix

It is particularly advantageous to use as a control matrix, the Hadamard-martrix since the attainable interference interval is appreciably greater when applying test signals at all inputs, compared to an application of only one test signal at one input.

Accordingly, while a few embodiments of the present invention have been shown and described, it is to be understood that many changes and modifications may be made thereunto without departing from the spirit and scope of the invention as defined in the appended claims.

What is claimed is:

1. A method for the determination of the impulse response g(t) of a broad band linear system which comprises the steps of:
    a) producing a high frequency clock pulse with a frequency of $f_c \geq 100$ MHz;
    b) producing a periodic MLBS m(t) of the order m, and a period length of $2^m - 1$ pulses of the high frequency clock pulse;
    c) amplificating and coupling the periodic MLBS m(t) as test signal x(t) to the broad band linear system;
    d) receiving and amplifying the response signal of said broad band linear system as a measured signal y(t) to adapt it in its amplitude to the next following units;
    e) providing a sampling clock pulse by dividing the high frequency clock rate by the factor of $2^n$;
    f) sampling the analog measured signal over at least $2^n$ periods, and providing sampled analog values, whereby the sample time points are predetermined through the sample pulse and during each period $2^m - \frac{1}{2^n}$ sampled data are gathered;
    g) converting said analog sampling values into digital sampled values; and,
    h) determining the impulse response g(t) through calculation of the cross-correlation ψ between the test signal and said digital measured signal under carrying out of a fast Hadamard-transformation (FHT) by determining the order of said digital sampled values.

2. The method according to claim 1, wherein the frequency $f_c$ of said high frequency clock pulse is adjustable.

3. The method according to claim 1, wherein the order m of the maximum sequence is adjustable.

4. The method according to claim 1, wherein said sampled values are intermediately stored and are used for sampling the next following values of the measured signal as a reference value, whereby the sampling time points are distributed over various periods, but projected onto a signal period not more than the length of a period tc of the high frequency clock pulse spaced apart from one another.

5. The method according to claim 1, wherein the MLBS m (t) modulates a high frequency carrier signal c(t), so as to shift the spectrum of the MLBS, and provide a modified MLBS n(t).

6. The method according to claim 5, wherein the sampling clock rate is chosen to be the $2^n/i$-th part of the high frequency clock rate, wherein i is an odd number greater than 1 (i=2n+1; i>1) the method further comprising the steps of:

arranging the values of the clock pulse signal to the sample time points being in a matrix c(t);
    multiplying the digital sample values with the high frequency clock pulse signal and arranging these values in a matrix m(t).c(t);
    permuting the two output matrices m(t).c(t) and c(t) in a conversion sort whereby in each matrix, the lines are collected into line groups with each i lines, an intermediate matrix is formed in which the lines are arranged in ascending order, primarily in accordance with their position within the line groups and secondarily according to the position of the line groups in the starting matrix the columns of the intermediate matrix are collected to column groups with each i columns;
    forming a target matrix from the intermediate matrix in which the columns are arranged in ascending order, primarily in accordance with their position in the column groups and secondarily according to the position of the column grous in the intermediate matrix;
    performing a correlation to solve the matrix-equation with the target matrix using the Hadamard-transformation, and a simple addition.

7. The method according to claim 1, for the determination of the impulse responses of a broad band linear system with K inputs (K>1) and L outputs (L>1) wherein at the same time or successively at each input of the system, a MLBS is provided as test signal x(t); and wherein the method further comprises the steps of:

taking a measured signal y(t) at each output of the system;

carrying out at least K measurements with other combinations of the test signals x(t) at the inputs; and determining all of the impulse responses.

8. The method according to claim 7, wherein positive or negative polarized MLBSs are applied, or not applied at the inputs, according to a combinatory scheme A, which presents an Hadamard-matrix.

9. A measuring circuit for determining the impulse response g(t) of a broad band linear system (11) comprising:

a) a pulse generator (2) for providing a high frequency clock pulse $f_c$;

b) an RF unit (1) comprising:

i) a MLBS generator (4) coupled to said high frequency clock pulse $f_c$, for providing a MLBS signal m(t) of the order m;

ii) an output amplifier (8) for receiving said MLBS m(t) and passing it to a broad band linear system (11);

iii) a controllable input amplifier (13) for receiving and amplifying a response signal from said broad band linear system (11) as a measured signal y(t) for adapting this signal to the next following circuit units;

iv) a digital clock pulse divider (18) for dividing the high frequency clock pulse fc in a predetermined ratio $2^n$, and for providing a sampling clock pulse, at its output, and v) a sampling circuit (17) which is controlled by said sampling clock, and samples the received measured signal y(t) from said input amplifier (13), c) an analog-digital converter (19) for receiving analog sampled values from said sampling circuit (17) and converting these into digital sample values;

d) a calculating unit (20, 21, 22) which combines said individual digital sampled values into a digital measured signal and calculates the impulse response by application of a fast Hadamard-transformation; and e) an interface unit (23) for coupling said impulse response to the next following indicator and storage and data processing units.

10. The measuring circuit according to claim 9, wherein said high frequency component group comprises an integrated circuit having:

a clock pulse input (70) having said high frequency clock pulse fc coupled to its input, a switch gate (71) with a clock pulse switch input (72) which allows the through switching of said high frequency clock pulse;

a clock pulse regenerator unit (73) which receives said clock pulse from said switch gate (71) regenerates said pulse, and passes it to the other circuit unit of the high frequency component group as well as to a clock pulse output (74).

11. The measuring circuit according to claim 10, wherein several high frequency component groups (1) are operated in parallel and deliver MLBS signals m(t) at various inputs (x1, x2, x3) of the linear system (11) and measured signals are received from the various outputs (y1, y2, y3) of the system.

12. The measuring circuit according to claim 11, wherein said clock pulse output (74) of the first high frequency component group couples said clock pulse signal to said clock pulse input (70) of the next following high frequency component group, which in turn through its clock pulse output (74) provides the clock pulse signal to the next following high frequency component group and so on, whereby the looped-through clock pulse signal represents the sole high frequency synchronization between the high frequency component groups.

13. The measuring circuit according to claim 11, comprising a ring storage circuit with $2^m-1$ storage cells in which are intermediately stored, said sample values determined in a prior sampling cycle and used for the generation of said return-signal.

14. The measuring circuit according to claim 9, further comprising a converter switch (7) for providing the MLBS m(t) to either non-negating or negating input of output amplifier (8) or disconnects the coupling between MLBS generator (4) and output amplifier (8).

15. The measuring circuit according to claim 9, wherein said MLBS generator (4) has a release input (75) which receives a start/stop signal for commencing the MLBS, whereby said start/stop signal coupled from the output of a synchronisation circuit (76), controls the input time point to the release input (75), with the aid of said sampling clock pulse.

16. The measuring circuit according to claim 9, wherein the power supply of the measuring circuit is configured as a switching circuit and operated in a synchronous manner with respect to the sampled clock signal.

17. The measuring circuit according to claim 9, comprising a digital-analog converter (25) for converting into analog feedback signal, the determined sample values, determined in a prior sampling cycle wherein said analog feedback signal is passed to said sampling circuit 17 at its return input, so that only the difference between return-signal and measured signal is measured by said sampling circuit (17).

* * * * *

UNITED STATES PATENT AND TRADEMARK OFFICE
CERTIFICATE OF CORRECTION

PATENT NO. : 6,272,441 B1
DATED : August 7, 2001
INVENTOR(S) : Peyerl et al.

It is certified that error appears in the above-identified patent and that said Letters Patent is hereby corrected as shown below:

Title page,
The Title page, showing an illustrative figure, should be deleted and substitute therefore the attached title page.

Drawings,
Delete drawing sheet(s) 3-6, and substitute therefore the drawing sheets(s) consisting of Fig(s) 1,3,4,10 as shown on the attached pages.

Signed and Sealed this

Twenty-eighth Day of May, 2002

Attest:

JAMES E. ROGAN
Director of the United States Patent and Trademark Office

Attesting Officer

(12) United States Patent
Peyerl et al.

(10) Patent No.: US 6,272,441 B1
(45) Date of Patent: Aug. 7, 2001

(54) METHOD FOR DETERMINING THE PULSE RESPONSE OF A BROAD BAND LINEAR SYSTEM AND A MEASURING CIRCUIT FOR CARRYING OUT THE METHOD

(76) Inventors: Peter Peyerl, Hartmann-Schaffer-Str. 20, D-98593 Ilmenau; Jürgen Sachs, Gartenstrasse 15, D-98711 Schmiedefield, both of (DE)

(*) Notice: Subject to any disclaimer, the term of this patent is extended or adjusted under 35 U.S.C. 154(b) by 0 days.

(21) Appl. No.: 09/417,036
(22) Filed: Oct. 12, 1999
(30) Foreign Application Priority Data Oct. 12, 1998 (DE) .................................. 198 46 870

(51) Int. Cl.[7] .................................................. G01R 35/00
(52) U.S. Cl. .................... 702/112; 702/110; 702/122; 324/76.21; 324/76.24; 708/400
(58) Field of Search ............................... 702/109, 110, 702/112, 122, 124–126; 324/76.19, 76.21, 76.22, 76.24; 708/309, 400, 403

(56) References Cited

U.S. PATENT DOCUMENTS 3,710,082 * 1/1973 Sloane et al. ............................ 700/280
3,714,566 * 1/1973 Kang ..................................... 324/76.22
4,067,060 * 1/1978 Poussart et al. ....................... 702/110
5,168,456 * 12/1992 Hyatt ..................................... 708/422
5,555,507 * 9/1996 Wolf et al. ............................. 702/122

FOREIGN PATENT DOCUMENTS 42 09 761   10/1992   (DE) .

OTHER PUBLICATIONS

M. Vorländer, "Applications of the Maximal Sequence Measuring Technique in Acoustics", Advances in Acoustics--DAGA 94 in Bad Honneff: DPG GmbH 1994, pp. 83–102, (No translation).

H. Alrutz, "Concerning the Application of Random Noise Sequences for Measuring of Linear Transmission Systems", Göttingen, 1983, pp. 56–58 (No translation).

* cited by examiner

Primary Examiner—Patrick Assouad
Assistant Examiner—Bryan Bui
(74) Attorney, Agent, or Firm—Collard & Roe, P.C.

(57) ABSTRACT

The invention relates to a method for the determination of the impulse response g(t) of a broad band linear system. The method can be used for the application of high frequency technology. For a test signal, a maximum length binary sequence (MLBS) is employed. The measured signal, obtained by the system, is sampled under maintenance of the sample theorem whereby the sampling clock in accordance with the invention is obtained directly from that high frequency clock pulse which is used for the generation of the MLBS. The digitized measured signal is then subjected to a fast Hadamard-transformation for calculation of the impulse response. The invention furthermore, provides a measuring circuit which carries out this method.

17 Claims, 11 Drawing Sheets

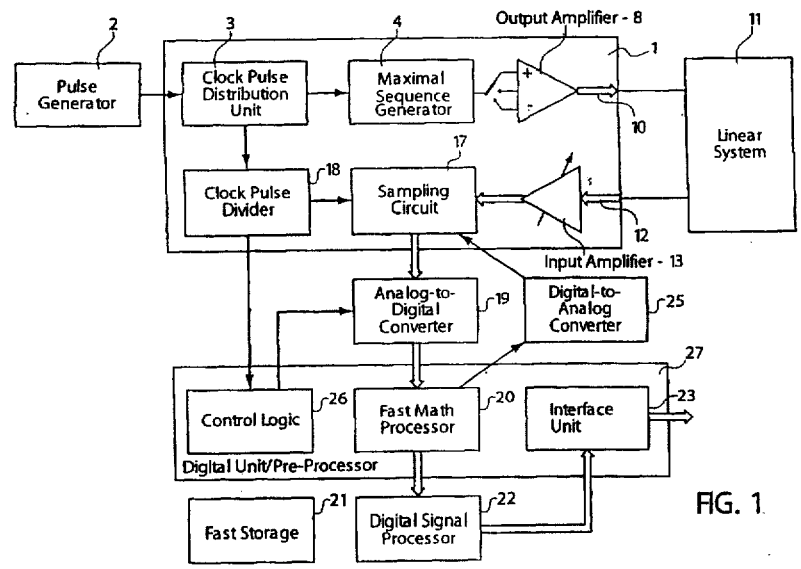

FIG. 1